US011009565B2

(12) United States Patent
Fernandez et al.

(10) Patent No.: US 11,009,565 B2
(45) Date of Patent: May 18, 2021

(54) MAGNETIC FIELD SENSOR AND ASSOCIATED METHOD THAT CAN STORE A MEASURED THRESHOLD VALUE IN A MEMORY DEVICE DURING A TIME WHEN THE MAGNETIC FIELD SENSOR IS POWERED OFF

(71) Applicant: Allegro MicroSystems, LLC, Manchester, NH (US)

(72) Inventors: Devon Fernandez, Londonderry, NH (US); Haeyoung Choi, Nashua, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/132,642

(22) Filed: Apr. 19, 2016

(65) Prior Publication Data
US 2016/0231393 A1 Aug. 11, 2016

Related U.S. Application Data

(63) Continuation of application No. 13/833,847, filed on Mar. 15, 2013, now Pat. No. 9,395,391.

(51) Int. Cl.
G01R 33/00 (2006.01)
G01R 1/44 (2006.01)
G01R 33/02 (2006.01)
G01D 3/036 (2006.01)
G01D 5/244 (2006.01)

(52) U.S. Cl.
CPC ....... *G01R 33/0082* (2013.01); *G01D 3/0365* (2013.01); *G01D 5/2448* (2013.01); *G01D 5/2449* (2013.01); *G01R 1/44* (2013.01); *G01R 33/02* (2013.01)

(58) Field of Classification Search
None
See application file for complete search history.

(56) References Cited

U.S. PATENT DOCUMENTS

| 4,570,594 A | 2/1986 | Egami et al. |
| 5,055,781 A * | 10/1991 | Sakakibara ............... G01B 7/30 257/E43.004 |
| 5,502,376 A | 3/1996 | Busch |
| 5,869,962 A | 2/1999 | Kasumi et al. |

(Continued)

FOREIGN PATENT DOCUMENTS

| DE | 101 39 149 A1 | 2/2003 |
| DE | 10139149 | 2/2003 |

(Continued)

OTHER PUBLICATIONS

Machine English Translation of DE10139149 to Gintner (Year: 2003).*

(Continued)

*Primary Examiner* — Douglas X Rodriguez
(74) *Attorney, Agent, or Firm* — Daly, Crowley, Mofford & Durkee, LLP

(57) ABSTRACT

A magnetic field sensor includes a comparator detector for which a measured threshold value is stored prior to power down and recalled upon power up for use by the comparator detector. A corresponding method is associated with the magnetic field sensor.

34 Claims, 10 Drawing Sheets

(56) References Cited

U.S. PATENT DOCUMENTS

| | | | |
|---|---|---|---|
| 5,917,320 A | 6/1999 | Scheller et al. | |
| 6,091,239 A | 7/2000 | Vig et al. | |
| 6,242,908 B1 | 6/2001 | Scheller et al. | |
| 6,252,395 B1 | 6/2001 | Aoyama et al. | |
| 6,297,627 B1 * | 10/2001 | Towne | H03G 3/001 |
| | | | 324/207.12 |
| 6,445,176 B1 | 9/2002 | Wallrafen | |
| 6,525,531 B2 | 2/2003 | Forrest et al. | |
| 6,781,359 B2 | 8/2004 | Stauth et al. | |
| 6,815,944 B2 | 11/2004 | Vig et al. | |
| 7,026,808 B2 | 4/2006 | Vig et al. | |
| 7,033,071 B2 | 4/2006 | Otsuka | |
| 7,184,876 B2 | 2/2007 | Teulings et al. | |
| 7,199,579 B2 | 4/2007 | Scheller et al. | |
| 7,253,614 B2 | 8/2007 | Forrest et al. | |
| 7,265,531 B2 | 9/2007 | Stauth et al. | |
| 7,362,094 B2 | 4/2008 | Voisine et al. | |
| 7,368,904 B2 | 5/2008 | Scheller et al. | |
| 7,369,969 B2 | 5/2008 | Scherr | |
| 7,592,801 B2 | 9/2009 | Bailey et al. | |
| 7,622,914 B2 | 11/2009 | Bailey et al. | |
| 7,772,838 B2 | 8/2010 | Bailey et al. | |
| 7,923,997 B2 | 4/2011 | Utsuno | |
| 8,138,750 B2 | 3/2012 | Fink et al. | |
| 8,350,563 B2 | 1/2013 | Haas et al. | |
| 8,598,867 B2 | 12/2013 | Foletto et al. | |
| 8,723,512 B1 | 5/2014 | Burdette et al. | |
| 8,860,404 B2 | 10/2014 | Dwyer et al. | |
| 8,860,410 B2 | 10/2014 | Petrie | |
| 9,052,349 B2 | 6/2015 | Haas et al. | |
| 9,222,990 B2 | 12/2015 | Dwyer et al. | |
| 2004/0104724 A1 | 6/2004 | Sato | |
| 2005/0036775 A1 | 2/2005 | Morimoto | |
| 2005/0146322 A1 | 7/2005 | Hoffman et al. | |
| 2006/0152226 A1 | 7/2006 | Steinruecken et al. | |
| 2006/0206829 A1 | 9/2006 | Kornamura _ et al. | |
| 2006/0224350 A1 | 10/2006 | Tanizawa | |
| 2007/0164732 A1 | 7/2007 | Voisine et al. | |
| 2008/0074106 A1 | 3/2008 | Oohira | |
| 2009/0001965 A1 * | 1/2009 | Ausserlechner | G01D 5/145 |
| | | | 324/202 |
| 2009/0206829 A1 | 8/2009 | Kamiya et al. | |
| 2010/0046121 A1 | 2/2010 | Osugi et al. | |
| 2010/0181993 A1 | 7/2010 | Fernandez et al. | |
| 2011/0119015 A1 | 5/2011 | Hirobe et al. | |
| 2011/0298448 A1 | 12/2011 | Foletto et al. | |
| 2011/0298450 A1 | 12/2011 | Foletto et al. | |
| 2012/0086442 A1 | 4/2012 | Haas et al. | |
| 2012/0158335 A1 | 6/2012 | Donovan et al. | |
| 2012/0217955 A1 | 8/2012 | Petrie | |
| 2012/0249126 A1 | 10/2012 | Friedrich et al. | |
| 2012/0299588 A1 | 11/2012 | Petrie | |
| 2013/0093416 A1 | 4/2013 | Haas et al. | |
| 2013/0116945 A1 | 5/2013 | Forrest et al. | |
| 2013/0176012 A1 | 7/2013 | Eagen et al. | |
| 2013/0177040 A1 | 7/2013 | Foletto et al. | |
| 2013/0335069 A1 | 12/2013 | Vig et al. | |
| 2014/0019084 A1 * | 1/2014 | Rolew | G01D 5/145 |
| | | | 702/150 |
| 2014/0062463 A1 | 3/2014 | Foletto et al. | |
| 2014/0210023 A1 | 7/2014 | Wang | |
| 2014/0222364 A1 | 8/2014 | Foletto et al. | |
| 2014/0266176 A1 | 9/2014 | Fernandez et al. | |
| 2015/0061656 A1 | 3/2015 | Fernandez et al. | |

FOREIGN PATENT DOCUMENTS

| | | | | |
|---|---|---|---|---|
| DE | 10139149 A1 * | 2/2003 | | G01P 3/489 |
| DE | WO 2012089366 A1 * | 7/2012 | | G01D 5/145 |
| EP | 0 024 836 A1 | 3/1981 | | |
| EP | 0 456 302 A2 | 11/1991 | | |
| EP | 0 456 302 A3 | 11/1991 | | |
| EP | 0 456 392 A2 | 11/1991 | | |
| EP | 0 456 392 A3 | 11/1991 | | |
| JP | 04-040007 | 2/1992 | | |
| JP | H04-40007 | 2/1992 | | |
| JP | H4-40007 A | 2/1992 | | |
| JP | H04136713 A | 5/1992 | | |
| JP | H11-257993 | 9/1999 | | |
| JP | 2000-258162 A | 9/2000 | | |
| JP | 2001-153745 A | 6/2001 | | |
| JP | 2002076077 A | 3/2002 | | |
| JP | 2003-315770 | 11/2003 | | |
| JP | 2003315570 | 11/2003 | | |
| JP | 2004/040007 | 2/2004 | | |
| JP | 2004-040007 | 2/2004 | | |
| JP | 2004-245804 A | 9/2004 | | |
| JP | 2004-279324 A | 10/2004 | | |
| JP | 2004340618 A | 12/2004 | | |
| JP | 2005062372 A | 3/2005 | | |
| JP | 2005106822 A | 4/2005 | | |
| JP | 2006-511815 | 4/2006 | | |
| JP | 2006113023 A | 4/2006 | | |
| JP | 2006511815 A | 4/2006 | | |
| JP | 2006-28375 | 10/2006 | | |
| JP | 2006-284375 | 10/2006 | | |
| JP | 2006284375 | 10/2006 | | |
| JP | 2007107922 | 4/2007 | | |
| JP | 2008-256415 | 10/2008 | | |
| JP | 2008/256415 | 10/2008 | | |
| JP | 2008256415 | 10/2008 | | |
| JP | 2008-309626 A | 12/2008 | | |
| JP | 2009-20117 | 1/2009 | | |
| JP | 2009/128437 A | 6/2009 | | |
| JP | 2009168782 A | 7/2009 | | |
| JP | 2008-256415 | 10/2009 | | |
| JP | 2009-281881 A | 12/2009 | | |
| JP | H4-40007 | 2/2010 | | |
| JP | 2010/049755 A | 3/2010 | | |
| JP | 2012-060230 A | 3/2012 | | |
| KR | 10-1863602 | 6/2018 | | |
| WO | WO 2004/079385 A1 | 9/2004 | | |
| WO | WO 2007/000746 A2 | 1/2007 | | |
| WO | WO 2008/145662 A1 | 12/2008 | | |
| WO | WO 2009/154157 A1 | 12/2009 | | |
| WO | WO 2010/010811 A1 | 1/2010 | | |
| WO | WO2012089366 A1 | 7/2012 | | |
| WO | WO 2013/017211 A1 | 2/2013 | | |
| WO | WO 2013/103478 | 7/2013 | | |

OTHER PUBLICATIONS

Response dated Apr. 28, 2016 to Office Action dated Oct. 21, 2015; For European Pat. App. No. 14706448.9; 4 pages.

Amended Specification and Claims dated Apr. 28, 2016; For European Pat. App. No. 14706448.9; 11 pages.

Letter from Yuasa and Hara dated May 30, 2016; For Japanese Pat. App. No. 2013-533859; 3 pages.

Pre-Trial Report with English Translation dated Apr. 14, 2016; For Japanese Pat. App. No. 2013-533859; 9 pages.

Notice of Transferal dated Apr. 26, 2016; For Japanese Pat. App. No. 2013-533859; 1 page.

Claims on File dated May 30, 2016; For Japanese Pat. App. No. 2013-533859; 7 pages.

Japanese Voluntary Amendment (With Reporting Letter and Claims in English) filed on Jun. 14, 2016 for Japanese application No. 2016-030552; 16 Pages.

Office Action for U.S. Appl. No. 14/250,574 dated Sep. 2, 2016; 31 pages.

Response to Office Action dated Sep. 2, 2016 corresponding to U.S. Appl. No. 14/250,574; Response filed on Nov. 22, 2016; 14 Pages.

Translation of Reasons for Rejection dated Dec. 26, 2016 for JP Pat. Appl. No. 2016-030552; 11 pages.

Claims now on file from Yuasa and Hara Letter dated Jan. 25, 2017 for JP Pat. Appl. No. 2016-030552; 8 Pages.

Letter from Yuasa and Hara dated Feb. 16, 2017 for JP Pat. Appl. No. 2016-500232; 1 page.

English translation of Claims Now on File related to Yuasa and Hara letter dated Feb. 16, 2017 for JP Pat. Appl. No. 2016-500232; 13 Pages.

(56) References Cited

OTHER PUBLICATIONS

Letter to Yuasa and Hara dated Jan. 6, 2017 for JP. Pat. Appl. No. 2016-500232; 2 pages.
Amended Claims dated Jan. 6, 2017 for JP Pat. Appl. No. 2016-500232; 8 pages.
Claims dated Jan. 6, 2017 for Continuation U.S. Appl. No. 15/132,642; 9 pages.
Yuasa and Hara translation of Reason for Rejection dated Dec. 26, 2016 for JP Pat. Appl. No. 2016-030552; 11 pages.
Letter from Yuasa and Hera dated Mar. 22, 2017 with Amended Claims for JP Pat. Appl. No. 2016-030552; 10 pages.
U.S. Appl. No. 15/466,894, filed Mar. 23, 2017, Foletto et al.
Communication pursuant to Article 94(3) EPC dated May 31, 2017 for EP Pat. Appl. No. 12809919.9-1568; 5 pages.
Allegro Microsystems, Inc.; Data Sheet ATS673 and ATS674; Self-Calibrating TPOS Gear Tooth Sensor IC Optimized for Automotive Cam Sensing Application; Jan. 14, 2005; 20 pages.
Allegro Microsystems, Inc.; Data Sheet ATS675LSE; Self-Calibrating TPOS Speed Sensor IC Optimized for Automotive Cam Sensing Applications; Jul. 14, 2008; 13 pages.
Allegro Microsystems, Inc.; Design Intent Data Sheet; A1340; "High Precision, Highly Programmable Linear Hall Effect Sensor IC with EEPROM and Analog Output with Advanced Output Linearization Capabilities;" Sep. 10, 2009; pp. 1-40.
Allegro Microsystems, Inc.; Design Intent Data Sheet; A1341; "High Precision, Highly Programmable Linear Hall Effect Sensor IC with EEPROM, Output Protocols SENT and PWM, and Advanced Output Linearization Capabilities;" May 17, 2010; pp. 1-46.
Claims on File dated Mar. 8, 2016; for Japanese Pat. App. No. 2013-533859; 7 pages.
European Notice of Allowance dated Aug. 29, 2014; for European Pat. App. No. 11 767 332.7; 7 pages.
European Notice of Allowance dated Jan. 29, 2015; for European Pat. App. No. 11767332.7; 2 pages.
European Official Communication dated Apr. 23, 2013; for EP Pat. App. No. 11767332.7; 2 pages.
European Response to Written Opinion (including English claims) filed on May 19, 2015; for European Pat. App. No. 12809919.9; 4 pages.
European Search Report dated Apr. 21, 2015; for European Pat. App. No. 15156091.9; 9 pages.
Japanese Office Action with English translation dated Oct. 27, 2015; For Japanese Pat. App. 2013-533859; 4 pages.
Japanese Reasons for Rejection (English Translation) dated Feb. 24, 2015; for Japanese Pat. App. No. 2013-533859; 11 pages.
Japanese Response (including English claims) filed on May 14, 2015; for Japanese Pat. App. No. 2013-533859; 21 pages.
Letter from Yuasa and Hara dated Mar. 8, 2016; for Japanese Pat. App. No. 2013-533859; 2 pages.
Letter from Yuasa and Hara dated Mar. 8, 2016; For Japanese Pat. App. No. 2016-030552; 2 pages.
Letter to Yuasa and Hara (including English claims) dated May 4, 2015; for Japanese Pat. App. No. 2013-533859; 15 pages.
Letter to Yuasa and Hara with Claim Amendments dated Jan. 25, 2016; For Japanese Pat. App. No. 2013-533859; 18 pages.
Melexis MLX 90324; ""Under-the-Hood" Triaxis Rotary Position feat. SENT Protocol;" 3901090324 Data Sheet; Dec. 2008; 40 pages.
Notice of Allowance dated Dec. 19, 2014; for U.S. Appl. No. 13/705,423; 18 pages.
Notice of Allowance dated Jan. 17, 2014; for U.S. Appl. No. 13/345,021; 15 pages.
PCT International Preliminary Report on Patentability and Written Opinion of the ISA; dated Apr. 25, 2013; for PCT Pat. App. No. PCT/2011/051493; 10 pages.
PCT International Preliminary Report on Patentability and Written Opinion of the ISA dated Sep. 24, 2015; For Pat. App. No. PCT/US2014/015678; 13 pages.
PCT International Preliminary Report on Patentability with Written Opinion for PCT/US2012/068879 dated Jul. 17, 2014 7 pages.

PCT International Search Report and Written Opinion of the ISA dated Aug. 21, 2014; for PCT Pat. App. No. PCT/US2014/015678; 18 pages.
PCT Invitation to Pay Additional Fees and Partial Search Report of the ISA dated May 9, 2014; for PCT Pat. App. No. PCT/US2014/015678; 5 pages.
PCT Search Report and Written Opinion dated Nov. 14, 2011; for PCT Pat. App. No. PCT/US2011/051493; 12 pages.
PCT Search Report and Written Opinion of the ISA; dated Mar. 27, 2013; for PCT Pat. App. No. PCT/US2012/068879; 10 pages.
Request for Continued Exaination filed Apr. 14, 2015; for U.S. Appl. No. 13/705,423; 2 pages.
Response dated Jan. 28, 2016 to European Office Action dated Aug. 3, 2015; for European Pat. App. No. 15156091.9; 5 pages.
Response to European Official Communication filed on Oct. 31, 2013; for European Pat. App. No. 11767332.7; 21 pages.
U.S. Appl. No. 13/833,847, filed Mar. 15, 2013; 300 pages.
U.S. Appl. No. 13/833,847, filed Mar. 15, 2013; 257 pages.
Amendments made in Korean Application No. 10-2013-7010374 filed on Dec. 26, 2017; 3 pages.
Notice to Submit a Response English Translation dated Oct. 30, 2017 for KR Pat. Appl. No. 10-2013-7010374; 10 pages.
EP Response to Official Communication filed on Sep. 26, 2017 for EP Pat. Appl. No. 12809919.9; 4 pages.
Allowed Claims from Allowance Report dated Aug. 23, 2017 for JP Pat. Appl. No. 2016-030552; 9 pages.
Examination Report for EP Pat. Appl. No. 12809919.9-1568 dated Nov. 13, 2017; 4 pages.
Office Action dated Jan. 19, 2018 for U.S. Appl. No. 15/466,894; 8 pages
A.A. Thornton Letter in response to official communication dated Mar. 23, 2018 for EP Pat. Appl. No. 12809919.9; 2 pages.
Amended Tracked Specification in response to official communication dated Mar. 23, 2018 for EP Pat. Appl. No. 12809919.9; 6 pages.
Amended Tracked Claims in response to official communication dated Mar. 23, 2018 for EP Pat. Appl. No, 12809919.9; 7 pages.
English Machine Translation of Notice of Reason for Rejection dated Feb. 2, 2018 for JP Pat. Appl, No. 2016-500232; 11 pages.
Claims Now on File dated Feb. 2, 2018 for JP Pat. Appl. No. 2016-500232; 13 pages.
Communication pursuant to Article 94(3) EPC dated Dec. 2, 2018 for EP Pat. Appl. No. 14706448.91022; 5 pages.
Claims Now on File dated Dec. 2, 2018 for EP Pat. Appl. No, 14706448.9-1022; 6 pages.
Letter from 21$^{st}$ Century Patent and Law Firm regarding Notice of Allowance dated Apr. 30, 2018 for KR Pat. Appl. No. 10-2013-7010374; 2 pages.
Korean Notice of Allowance dated Apr. 26, 2018 for KR Pat. Appl. No. 10-2013-7010374; 1 page.
Response to U.S. Non-Final Office Action dated Jan. 19, 2018 for U.S. Appl. No. 15/466,894; Response dated Mar. 19, 2018; 6 pages.
Notice of Allowance dated May 4, 2018 for U.S. Appl. No. 15/466,894; 12 pages
Communication regarding Intention to Grant dated Apr. 30, 2018 for EP Pat. EP12809919.9; 7 pages.
Allowed Specification regarding Intention to Grant dated Apr. 30, 2018 for RP Pat. Appl. No. EP12809919.9; 38 pages.
DCMD Letter to Foreign Associate dated Nov. 16, 2018 for Japanese Application No. 2016-500232 with instructions and proposed claim amendments; 2 Pages.
DCMD Proposed Claim Amendments dated Nov. 16, 2018 for Japanese Application No. 2016-500232; 16 Pages.
Letter from Foreign Associate dated Dec. 13, 2018 for Japanese Application No. 2016-500232 reporting response filed; 1 Page.
Claims on file dated Dec. 13, 2018 for Japanese Application No. 2016-500232; 14 Pages.
21$^{st}$ Century Patent & Law Firm letter dated Dec. 26, 2018 for KR Pat. Appl. No. 10-20187014962; 2 pages.
Notice of Allowance English translation dated Dec. 21, 2018 for KR Pat. Appl. No. 10-2018-7014962; 1 page.
Allowed Claims English translation for KR Pat. Appl. No. 10-2018-7014962; 8 pages.

(56) References Cited

OTHER PUBLICATIONS

Letter from 21$^{st}$ Century Patent & Law Firm dated Jun. 12, 2018; Reporting Registration of Korean Application No. KR 10-2013-7010374 was Registered with the Korean Intellectual Property Office as Korean Patent No. KR 10-1863602 on May 28, 2018; 4 pages.
English Translations of the Reason for Rejection dated Sep. 18, 20118 for Japanese Application No. 1026-500232; 6 pages.
English Translations of the Claims on File dated Sep. 18, 2018 for Japanese Application No. 1026-500232; 13 Pages.
European Application No. EP 12809919.9 Intention to Grant dated Apr. 30, 2018, 7 Pages.
Response to the Examination report dated Feb. 12, 2018 for European Application No. 14706448.9 as filed on Aug. 22, 2018; 5 Pages.
Amended Claims dated Aug. 22, 2018 for European Application No. 14706448.9; 7 Pages.
Yuasa & Hare letter dated Dec. 13, 2018 for JP Pat. Appl. No. 2016-500232; 1 page.
Yuasa & Hare Claims now on file for JP Pat. Appl. No. 2016-500232 dated Dec. 6, 2018; 14 pages.
DCMD instruction letter dated Nov. 16, 2018 for JP Pat. Appl. No. 2016-500232; 2 pages.
DCMD proposed claim amendments dated Nov. 2018 for JP Pat. Appl. No. 2016-500232; 16 pages.
DCMD Instruction Letter dated Sep. 10, 2018 for KR Appl. No. 10-2018-7014962; 2 pages.
21$^{st}$ Century Patent & Law Firm Letter dated Sep. 12, 2018 for KR Appl. No. 10-22018-7014962; 2 pages.
Current Claims from 21$^{st}$ Century Patent & Law Firm filed on Sep. 12, 2018 for KR Appl. No. 10-2018-7014962; 6 pages.
Notice to Submit a Response dated Jul. 31, 2018 from the Korean IPO Office for KR Appl. No, 10-2018-7014962; 12 pages.
21$^{st}$ Century Patent & Law Firm Letter dated Aug. 24, 2018 for KR Appl. No. 10-2018-7014962; 6 pages.
Invitation Pursuant to Rule 63(1) EPC dated Dec. 19, 1022for EP Pat. Appl. No 18196148.3-1022; 6 pages.
A.A. Thornton Response filed on Feb. 28, 2019 to Official Invitation dated Dec. 19, 2018 for EP Pat. Appl. No. 18196148.3; 3 pages.
21 $^{st}$ Century Patent & Law Firm dated Feb. 1, 2019 for KR Pat. Appl. No. 10-2015-7029179; 1 page.
DCMD Instruction Letter dated Jan. 3, 2019 for KR Pat. Appl. No. 10-2015-7029179; 2 pages.
Ciaim Amendments dated Jan. 3, 2019 for KR Pat. Appl. No. 10-2015-7029179; 27 pages.
Extended European Search Report dated Apr. 16, 2019 for European Application No. 18196148.3; 12 pages.
Response dated Aug. 14, 2019 for Japanese Application No. 2016-500232 with English Translation; 16 Pages.
Office Action dated May 17, 2019 for Japanese Application No. 2016-500232 with English Translation; 12 Pages.
Summons to attend oral proceeding pursuant to Rule 115(1) EPC dated Apr. 10, 2019 for European Application No. 14706448.9; 8 Pages.
Response to Office Action dated Nov. 15, 2019 for U.S. Appl. No. 15/975,942; 10 pages.
Office Action dated Aug. 20, 2019 for U.S. Appl. No. 15/975,942; 18 pages.
Response to summons to attend oral proceedings dated Oct. 21, 2019 for European Application No. 14706448.9; 50 pages.
Final Office Action dated Feb. 4, 2020 for U.S. Appl. No. 15/975,942; 18 pages.
European Intention to Grant dated Dec. 16, 2019 for European Application No. 14706448.9; 7 Pages.
Japanese Allowance Report (with Allowed Claims in English) dated Dec. 23, 2019 for Japanese Application No. 2016-500232; 18 Pages.
Response (with Amended Claims) to European Official Communication dated May 20, 2019 for European Application No. 18196148.3; Response dated Dec. 23, 2019; 14 Pages.
Notice of Allowance dated Sep. 30, 2020 for U.S. Appl. No. 15/975,942; 9 pages
Korean Response to Office Action with English translation dated Jun. 2, 2020 for Korean Application No. 10-2015-7029179; 145 pages.
Response to Examination Report dated Sep. 2, 2020 for European Application No. 18196148.3; 27 pages.
Extended Search Report dated Jun. 12, 2020 for European Application No. 20168379.4; 7 pages.
Notice of Allowance with English translation and Allowed claims dated Oct. 26, 2020 for Korean Application No. 10-2015-7029179; 29 pages.
Notice of Intent to Grant dated Feb. 17, 2021, for European Application No. 18196148.3; 48 pages.
Reply to official communication dated Aug. 24, 2020 and filed Feb. 19, 2021 in the EPO, Application No. EP20168379.4, 115 pages.
Notice of Allowance dated Sep. 12, 2012 for U.S. Appl. No. 12/902,410; 9 pages.
International Preliminary Report on Patentability dated Apr. 25, 2013 for PCT Application No. PCT/US2011/051493; 10 pages.
Notice of Allowance dated Jan. 4, 2017 for U.S. Appl. No. 14/250,574; 7 pages.
International Search Report and Written Opinion dated Mar. 27, 2013 for PCT Application No. PCT/US2012/068879; 10 pages.
European Examination Report dated Nov. 11, 2016 for European Application No. 12809919.9; 3 Pages.
Response to European Examination Report filed on Mar. 24, 2017 for European Application No. 12809919.9; 4 Pages.
European Examination Report dated Feb. 21, 2020 for European Application No. 18196148.3; 6 Pages.
Response to Office Action and Request for Examination (RCE) dated Mar. 17, 2020 for U.S. Appl. No. 15/975,942; 14 pages.
Search Report and Written Opinion dated Aug. 21, 2014 for PCT Application No. PCT/US2014/015678; 18 pages.
Communication pursuant to Rules 161(1) and 162 EPC dated Oct. 21, 2015 for European Application No. 14706448.9; 2 pages.
European Examination Report dated Feb. 12, 2018 for European Application No. 14706448.9; 5 Pages.
Japanese Office Action dated Feb. 2, 2018 for Japanese Application No. 2016-500232; 20 pages.
Letter from Yuasa and Hara enclosing Response to Japanese Office Action with English claims filed on Apr. 23, 2018 for Japanese Application No. 2016-500232; 27 pages.
Korean Office Action with English translation dated Apr. 24, 2020 for Korean Application No. 10-2015-7029179; 47 pages.
Response to Korean Office Action with English translation filed on Jun. 2, 2020, 2020 for Korean Application No. 10-2015-7029179; 106 pages.

* cited by examiner

MAGNETIC FIELD SENSOR AND ASSOCIATED METHOD THAT CAN STORE A MEASURED THRESHOLD VALUE IN A MEMORY DEVICE DURING A TIME WHEN THE MAGNETIC FIELD SENSOR IS POWERED OFF

CROSS REFERENCE TO RELATED APPLICATIONS

This application is a Continuation Application of and claims the benefit of U.S. patent application Ser. No. 13/833,847 filed Mar. 15, 2013, which is incorporated herein by reference in its entirety.

STATEMENT REGARDING FEDERALLY SPONSORED RESEARCH

Not Applicable.

FIELD

This invention relates generally to magnetic field sensors for sensing a rotation or a movement of an object and, more particularly, to a magnitude field sensor that generates a measured threshold value that can be stored in a memory device and later recalled.

BACKGROUND

Various types of magnetic field sensing elements are known, including Hall Effect elements and magnetoresistance elements. Magnetic field sensors generally include a magnetic field sensing element and other electronic components. Some magnetic field sensors also include a fixed permanent magnet.

Magnetic field sensors provide an electrical signal representative of a sensed magnetic field, or, in some embodiments, fluctuations of a magnetic field associated with the permanent magnet. In the presence of a moving ferromagnetic object (e.g., a gear, a ring magnet, or a linear multi-pole magnet), the magnetic field sensed by the magnetic field sensor can vary in accordance with a shape or profile of the moving ferromagnetic object.

Magnetic field sensors are often used to detect movement of features of a ferromagnetic gear, such as gear teeth and/or gear slots. A magnetic field sensor in this application is commonly referred to as a "gear tooth" sensor.

In some arrangements, the gear is placed upon a target object, for example, a camshaft in an engine, thus the rotation of the target object (e.g., camshaft) is sensed by detection of the moving features of the gear. Gear tooth sensors can be used in automotive applications, for example, to provide information to an engine control processor for ignition timing control, fuel management, and other operations.

Information provided by the gear tooth sensor to the engine control processor can include, but is not limited to, an absolute angle of rotation of a target object (e.g., a camshaft) as it rotates, and a direction of rotation. With this information, the engine control processor can adjust the timing of firing of the ignition system and the timing of fuel injection by the fuel injection system. Thus, it will be recognized that accurate information about the angle of rotation is important for proper engine operation.

Gear tooth sensors can also be used in other applications, including, but not limited to, anti-lock braking systems and in transmissions.

Many types of magnetic field sensors may not provide an accurate output signal (e.g., indication of absolute angle of rotation of an object) immediately upon power up of the magnetic field sensor, and/or immediately upon movement of the target object from zero rotating speed, and/or upon movement slowing to zero rotating speed, but instead provide an accurate output signal only once the magnetic field sensor has been powered up for a period of time, and the target object has moved through a substantial rotation or is moving with substantial speed.

The above accurate output signal refers to accuracy of the positions of transition edges (corresponding to gear teeth edges, ring magnet pole edges, or linear multi-pole magnet pole edges) in the output signal from the magnetic field sensor.

In general, a so-called "precision" rotation detector can provide an accurate output signal only after some period following power up of the magnetic field sensor and after the gear has been rotating for some period of time. In contrast, in general, a so-called "true power on state" (TPOS) detector can provide a reasonably accurate output signal, but less accurate than the precision rotation detector, at an earlier time after the magnetic field sensor powers up and at an earlier time after the gear starts rotating.

One type of precision rotation detector is described in U.S. Pat. No. 6,525,531, issued Feb. 25, 2003. This precision rotation detector includes a positive digital-to-analog converter (PDAC) and a negative digital-to-analog converter (NDAC) that track positive and negative peaks of magnetic field signal, respectively, for use in generating a threshold signal. A varying magnetic field signal is compared to the threshold signal. However, the outputs of the PDAC and the NDAC may not provide accurate indications of the positive and negative peaks of the magnetic field signal until several cycles of the signal (i.e., signal peaks) occur (i.e., until several gear teeth have passed). Other types of precision rotation detectors are described, for example, in U.S. Pat. No. 7,199,579, issued Apr. 2, 2007, U.S. Pat. No. 7,368,904, issued Apr. 6, 2008, U.S. Pat. No. 6,297,627, issued Oct. 2, 2001, and U.S. Pat. No. 5,917,320, issued Jun. 29, 1999, each of which is incorporated herein by reference, and each of which is assigned to the assignee of the present invention.

A conventional TPOS detector is described in U.S. Pat. No. 7,362,094, issued Apr. 22, 2008. Some conventional TPOS detectors simply compare a magnetic field signal with a fixed, predetermined, and sometimes trimmed, threshold.

A TPOS detector can be used in conjunction with a precision rotation detector, both providing information to the engine control processor. A TPOS detector can be combined in the same integrated circuit with a precision rotation detector, and the magnetic field sensor after power up, can first use the TPOS detector and then switch to use the precision rotation detector.

As described above, the conventional TPOS detector provides a reasonably accurate output signal with only a small initial rotation of the target object, and before the precision rotation detector can provide an accurate output signal. Furthermore, the TPOS detector can provide information about whether it is proximate to a gear tooth or a gear valley nearly immediately upon power up.

A TPOS detector can provide information to the engine control processor that can be more accurate than information provided by the precision rotation detector at times proximate to the time of power up of the magnetic field sensor, and also at times near the beginning and end of rotation of the target object (e.g., start and stop of the engine and camshaft). However, the TPOS detector may be less accurate than the precision rotation detector at some time after the magnetic field sensor has powered up and when the object is rotating at full speed. When the object is rotating at full speed, the engine control processor can primarily use rotation information provided by the precision rotation detector.

As described above, unlike the precision rotation detector, the conventional TPOS detector has a fixed predetermined threshold against which a magnetic field signal is compared. An output signal from a conventional TPOS detector has two states, typically a high and a low state, in accordance with features on the target object.

It is known that various parameters affect a magnitude of the magnetic field signal generated by the TPOS magnetic field sensor. For example, temperature is known to affect a sensitivity of the Hall element, and therefore, a magnitude of the magnetic field signal. Changes in size of an air gap between the TPOS magnetic field sensor and the TPOS cam or gear can also affect a magnitude of the magnetic field signal.

In a TPOS detector, when the magnetic field signal is compared against a fixed predetermined threshold, the changes in the amplitude of the magnetic field signal due to temperature, air gap, etc., can cause undesirable changes in positions of the edges in the above-described output signal from the TPOS detector.

A conventional TPOS detector can have a comparator therein operating as a comparator detector.

It would be desirable to provide TPOS detector, or more generally, a comparator detector, for which positions of edges of an output signal therefrom vary less than for a conventional TPOS or comparator detector.

SUMMARY

The present invention provides a TPOS detector, or more generally, a comparator detector, for which positions of edges of an output signal therefrom vary less than for a conventional TPOS or comparator detector.

In accordance with one aspect, a magnetic field sensor includes one or more magnetic field sensing elements configured to generate a magnetic field signal responsive to a magnetic field. The magnetic field sensor also includes a temperature compensating circuit coupled to receive the magnetic field signal and configured to generate a temperature compensated signal having a signal characteristic comprising least one of an amplitude or an offset. The magnetic field sensor also includes a memory device configured to store, at a storage time, a measured threshold value related to the signal characteristic of the temperature compensated signal. The magnetic field sensor also includes a comparator detector coupled to receive a comparator threshold value related to the stored measured threshold value and also coupled to receive a signal representative of the magnetic field signal, wherein the comparator detector is configured to compare the comparator threshold value with the signal representative of the magnetic field signal to generate a comparator detector output signal.

In accordance with another aspect, a method of sensing a magnetic field with a magnetic field sensor includes generating a magnetic field signal responsive to the magnetic field. The method also includes generating a temperature compensated signal related to the magnetic field signal, wherein the temperature compensated signal comprises a signal characteristic comprising least one of an amplitude or an offset. The method also includes storing, in a memory device, at a storage time, a measured threshold value related to the signal characteristic of the temperature compensated signal. The method also includes receiving, with a comparator detector, a comparator threshold value related to the stored measured threshold value and a signal representative of the magnetic field signal. The method also includes comparing, with the comparator detector, the comparator threshold value with the signal representative of the magnetic field signal to generate a comparator detector output signal.

In accordance with another aspect, a magnetic field sensor includes a magnetic field sensing element configured to generate a magnetic field signal responsive to a magnetic field. The magnetic field sensor also includes a measured threshold module coupled to receive at least one of a positive peak signal having a plurality of positive peak values or a negative peak signal having a plurality of negative peak values, the plurality of positive peak values representative of different respective positive peaks of the magnetic field signal and the plurality of negative peak values representative of different respective negative peaks of the magnetic field signal, wherein the measured threshold module is configured to combine the plurality of positive peak values and the plurality of negative peak values to generate the measured threshold value.

In accordance with another aspect, a method of sensing a magnetic field with a magnetic field sensor includes generating a magnetic field signal responsive to the magnetic field. The method also includes generating at least one of a positive peak signal having a plurality of positive peak values or a negative peak signal having a plurality of negative peak values, wherein the plurality of positive peak values is representative of different respective positive peaks of the magnetic field signal and the plurality of negative peak values is representative of different respective negative peaks of the magnetic field signal. The method also includes combining at least one of the plurality of positive peak values or the plurality of negative peak values to generate the measured threshold value.

In accordance with another aspect, a magnetic field sensor includes one or more magnetic field sensing elements configured to generate a magnetic field signal responsive to a magnetic field. The magnetic field sensor also includes a circuit coupled to receive the magnetic field signal and configured to generate an intermediate signal having a signal characteristic comprising least one of an amplitude or an offset. The magnetic field sensor also includes a memory device configured to store, at a storage time, a measured threshold value related to the signal characteristic of the intermediate signal. The magnetic field sensor also includes a comparator detector coupled to receive a comparator threshold value related to the stored measured threshold value without temperature compensating the stored measured threshold value, and also coupled to receive a signal representative of the magnetic field signal, wherein the comparator detector is configured to compare the comparator threshold value with the signal representative of the magnetic field signal to generate a comparator detector output signal.

In accordance with another aspect, a method of sensing a magnetic field with a magnetic field sensor includes generating a magnetic field signal responsive to the magnetic field. The method also includes generating an intermediate signal related to the magnetic field signal, wherein the amplified signal comprises a signal characteristic comprising least one of an amplitude or an offset. The method also includes storing, in a memory device, at a storage time, a measured threshold value related to the signal characteristic of the intermediate signal. The method also includes receiving, with a comparator detector, a comparator threshold value related to the stored measured threshold value without temperature compensating the stored measured threshold value, and a signal representative of the magnetic field signal. The method also includes comparing, with comparator detector, the comparator threshold value with the signal representative of the magnetic field signal to generate a comparator detector output signal.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
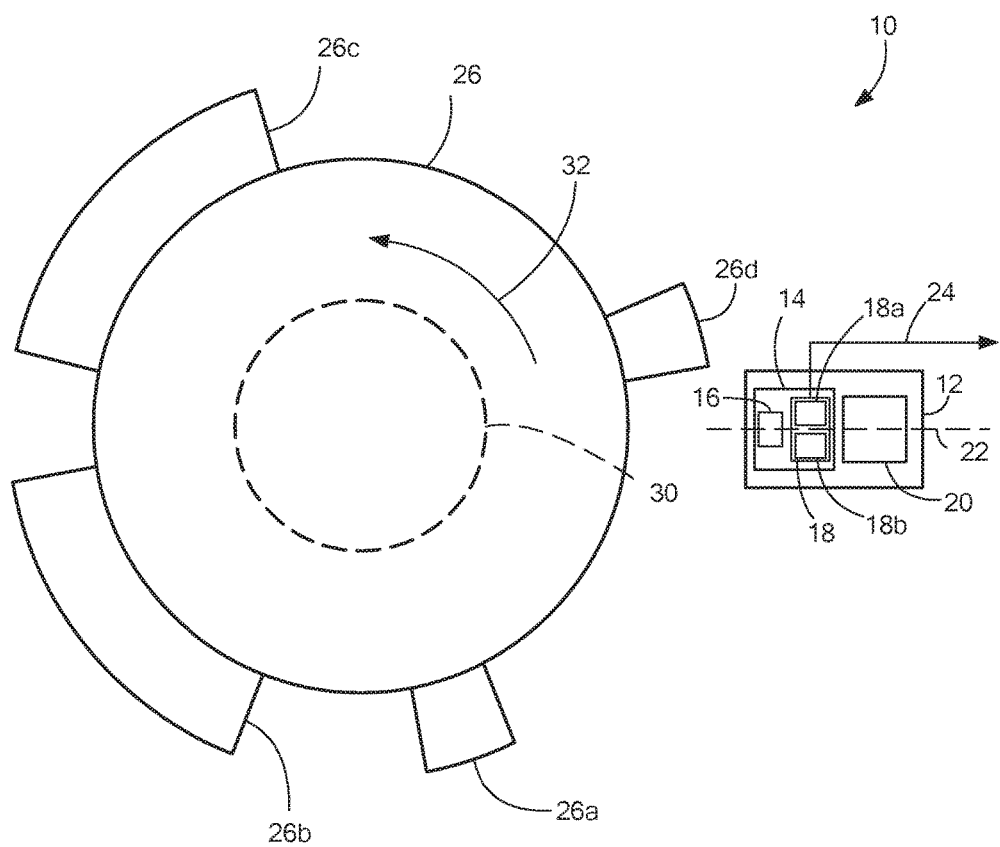
FIG. 1 is a block diagram showing a magnetic field sensor having a comparator detector in the form of a "true power on state" (TPOS) detector and a "precision rotation" detector, which is proximate to a gear having gear features, the gear disposed upon a shaft configured to rotate, i.e., upon a target object.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

The above-described "circular vertical Hall" (CVH) sensing element, another type of magnetic field sensing element, which includes a plurality of vertical magnetic field sensing elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element includes a circular arrangement of vertical Hall elements arranged over a common circular implant region (e.g., epitaxial region) in a substrate. The CVH sensing element can be used to sense a direction (and optionally a strength) of a magnetic field in a plane of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While exemplary circuits and methods are described below that use a Hall Effect element, in other embodiments, the same or similar techniques can be used in conjunction with another type of magnetic field sensing element.

Rotation detector types of magnetic field sensors are shown and described in examples, below. However, the same or similar techniques can be applied to any magnetic field sensor, and, desirably, to any magnetic field sensor that experiences temperature excursions and for which it is desirable to store a threshold when the magnetic field sensor is powered off.

Referring to FIG. 1, an exemplary magnetic field sensor arrangement 10 includes a magnetic field sensor 12. The magnetic field sensor 12 includes a magnetic field sensing circuit 14 having a magnetic field sensing element 16 coupled to an electronic circuit 18. The electronic circuit 18 can include a comparator detector 18, which, in some embodiments, can be a true power on state (TPOS) detector 18a, and a precision rotation detector 18b, both of which are described more fully below.

The magnetic field sensor 12 can also include a magnet 20. The magnet 20 is configured to generate a magnetic field directed along an axis 22. The electronic circuit 18 is configured to generate an output signal 24, which is generated by the TPOS detector 18a for a time period near to a start up of the magnetic field sensor 12, and which can be generated by the precision rotation detector thereafter.

The magnetic field sensor arrangement 10 can also include a cam 26 (e.g., gear) having features 26a, 26b, 26c, 26d. The cam 26 can be disposed, for example, upon a shaft 30 (i.e., a target object) configured to rotate in a direction 32.

In operation, as the cam 26 rotates, the cam features 26a, 26b, 26c, 26d interrupt the magnetic field generated by the magnet 20. Interruptions of the magnetic field generated by the magnet 20 are sensed by the magnetic field sensing element 16 and result in state transitions in the output signal 24.

Particular arrangement and spacing of the cam features 26a, 26b, 26c, 26d results in the TPOS detector 18a being able to provide the TPOS output signal 24 having transitions after only a small number of degrees of rotation of the TPOS cam 26, which, in some embodiments, can be interpreted by an engine control computer to generate an absolute angle of rotation of the cam 26 and of the shaft 30 upon which the cam 26 is disposed.

Furthermore, by circuits and techniques described below, the TPOS detector 18a can provide an indication of whether the magnetic field sensor 12 is proximate to a gear tooth or a gear valley at the time of power up of the magnetic field sensor 12.

Figure 2:
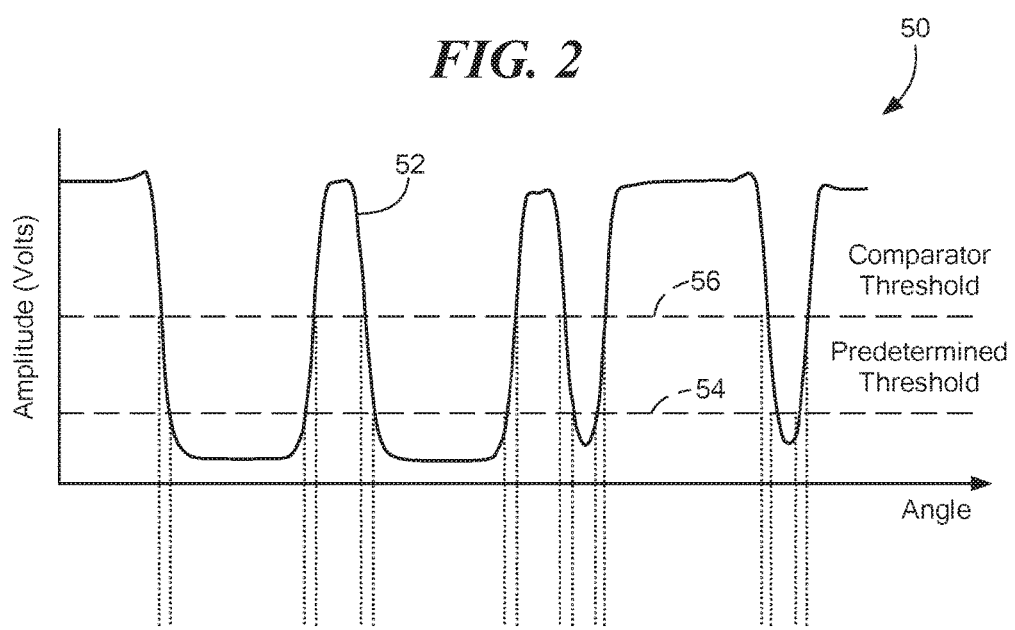
FIG. 2 is a graph showing a magnetic field signal and showing an exemplary calculated threshold and an exemplary predetermined threshold that can be compared with the magnetic field signal within the TPOS detector of FIG. 1.

Referring now to FIG. 2, a graph 50 has a horizontal axis with a scale in units of target object rotation angle, for example, from 0 to 360 degrees. The graph 50 also includes a vertical axis having a scale with units of volts in arbitrary units. A signal 52 can be the same as or similar to a magnetic field signal generated within the magnetic field sensor 12 of FIG. 1, for example, in conjunction with the magnetic field sensing element 16. It should be appreciated that the high state periods of the signal 52 correspond to the features 26a, 26b, 26c, 26d of the cam 26 of FIG. 1 as they pass by the magnetic field sensing element 16 of FIG. 1 as the cam 26 rotates.

The magnetic field signal 52 is shown in analog form having continuous analog values, but can equivalently be a signal having discrete digital values comparable to sampled ones of the analog values. While the signal 52 is indicated to be a voltage signal, in some other embodiments, the signal 52 is a current signal.

A predetermined threshold 54 is shown and further described below in conjunction with FIG. 3. The predetermined threshold 54 is similar to that which is used in a conventional TPOS detector. A comparator threshold 56, calculated (at different respective times) in accordance with one of a plurality of stored measured threshold is also shown and further described below in conjunction with FIG. 3. The comparator threshold 56, calculated in accordance with one of the plurality of stored measured threshold values, is not used by a conventional TPOS detector.

As used herein, the terms "comparator threshold" and "TPOS threshold" are used to mean essentially the same threshold.

Figure 3:
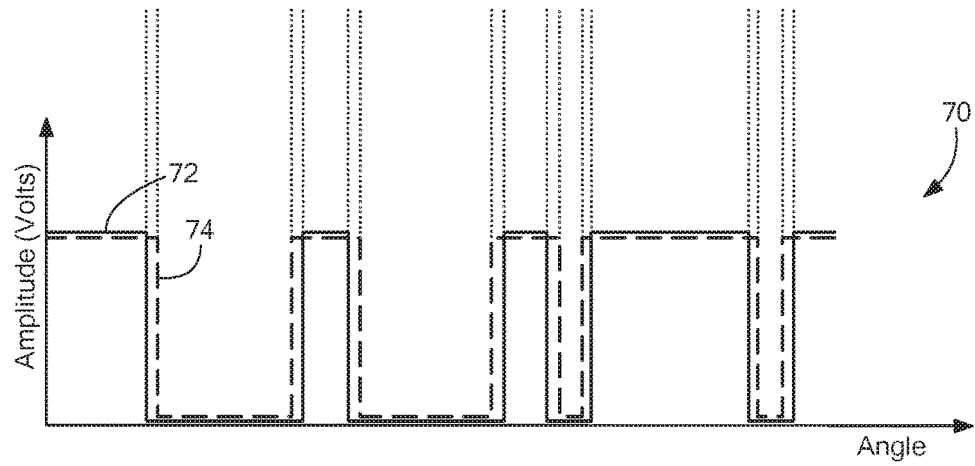
FIG. 3 is a graph showing signals resulting from the comparisons of FIG. 2.

Referring now to FIG. 3, a graph 70 has a horizontal axis with a scale in units of target object rotation angle, for example, from 0 to 360 degrees. The graph 70 also includes a vertical axis having a scale with units of volts in arbitrary units.

A signal 74 has two states, positions of transitions between which are determined by crossings of the signal 52 of FIG. 2 above and below the predetermined threshold 54. A signal 72 has two states, positions of transitions between which are determined by crossings of the signal 52 of FIG. 2 above and below the calculated threshold 56. Accordingly, it can be seen that changes in the position, i.e., the value, of the threshold used to compare against the signal 52 of FIG. 2, affects positions of the transitions, i.e., edges, of the resulting two state signal. As described above, when used for many applications, including, but not limited to automotive applications, positions of the edges can be very important to proper operation of the automobile.

As described above, the magnetic field signal 52 can vary in amplitude due to a variety of environmental and electronic factors, for example, temperature and air gap between the magnetic field sensor and the sensed cam or gear. It would be desirable to maintain a threshold signal comparable to the calculated threshold 56 of FIG. 2 that is at a favorable position between positive peaks and negative peaks of the magnetic field signal 52, even as the amplitude of the positive and negative peaks changes, for example, due to temperature, air gap between the magnetic field sensing element 16 of FIG. 1 and the cam 26, or other parameters. With such an arrangement, edges of the resulting two state signal 72 can remain at the same positions even if the amplitudes of the positive and negative peaks of the magnetic field signal 52 change and even if they change asymmetrically.

Figure 4:
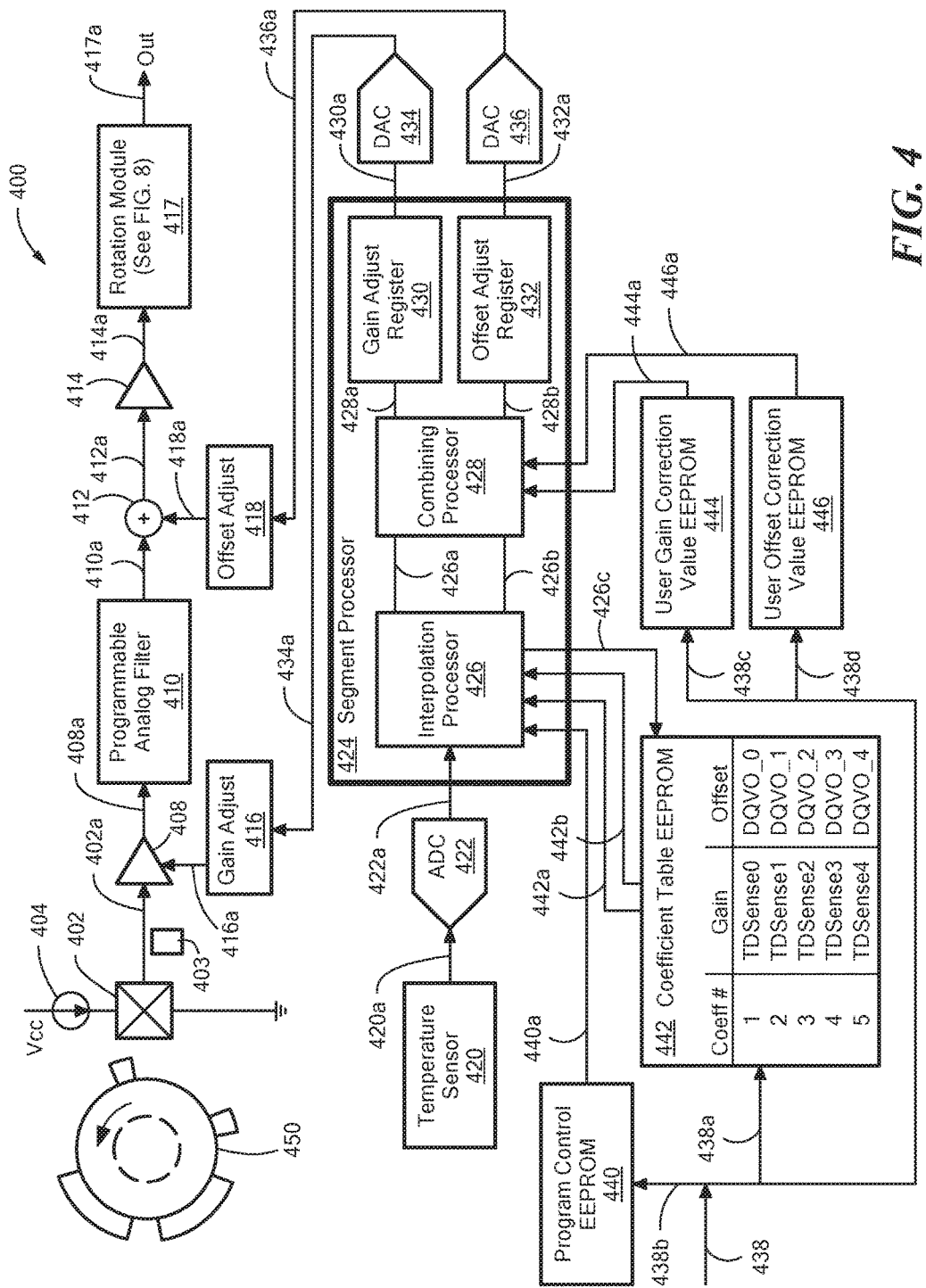
FIG. 4 is a block diagram showing a magnetic field sensor used to sense rotation of a gear, having a segment processor configured to correct gain and/or offset variations versus temperature, and also having a rotation module to provide and output signal indicative of rotation of the gear.

Referring to FIG. 4, a magnetic field sensor 400 includes a Hall Effect element 402 driven by a current source 404. The Hall effect element 402 is responsive to a magnetic field as may be generated, for example, by a magnet 403 disposed proximate to or within the magnetic field sensor 400. Rotation of a gear 450 can result in variations of the magnetic field sensed by the Hall Effect element, further resulting in a magnetic field signal 402a being an AC signal when the gear 450 rotates.

While a Hall effect element is shown, any type of magnetic field sensing element can be used. Also, while one magnetic field sensing element is shown, in other embodiments, there can be more than one magnetic field sensing elements coupled, for example, in a differential arrangement.

The magnetic field sensor 400 includes a signal path (analog or digital or mixed) comprised of an amplifier 408, a filter 410, which can be a programmable filter, a summing circuit 412, and an amplifier 414. The Hall Effect element 402 is configured to generate the magnetic field signal 402a responsive to the magnetic field. The amplifier 408 (e.g., a gain adjustable analog circuit) is coupled to receive the magnetic field signal 402a and to receive a gain control signal 416a and configured to generate a gain adjusted signal 408a. The filter 410 is coupled to receive the gain adjusted signal 408a and configured to generate a filtered signal 410a. The summing circuit 412 (e.g., an offset adjustable analog circuit) is coupled to receive the filtered signal 410a and to receive an offset control signal 418a and configured to generate an offset adjusted signal 412a. The amplifier 414 is coupled to receive the offset adjusted signal 412a and configured to generate an output signal 414a having gain and offset correction.

It should be recognized that the output signal 414a has an amplitude when the magnetic field sensor 402 is in the presence of a rotating gear 450 (or other moving ferromagnetic or magnetic object). The output signal 414a can also have a residual offset.

It should also be recognized that the order of the circuit functions embodied by the amplifiers 408, 414 can be made in any order without changing the general functions described herein. It should also be recognized that the circuit functions can be made in either the analog or digital domains.

In some other embodiments, the offset temperature compensation is not performed, in which case, the temperature sensor 420 and the ADC 422 are not required, and the offset temperature correction coefficients need not be stored in the EEPROM 442.

In some other embodiments, the gain temperature compensation is not performed, in which case, the temperature sensor 420 and the ADC 422 are not required, and the gain temperature correction coefficients need not be stored in the EEPROM 442.

In some other embodiments, neither the gain temperature compensation nor the offset temperature compensation are performed, in which case, at least the segment processor 424, the coefficient table EEPROM 442, the temperature sensor, and the ADC 422 are not required. For these embodiments, the signal 414a is an intermediate signal having no temperature compensation.

The magnetic field sensor 400 also includes a rotation module 417 coupled to receive the output signal 414a and configured to generate a rotation output signal indicative of at least the rotation of the gear 450, but optionally also a speed of rotation of the gear 450, and optionally also a direction of rotation of the gear 450. The rotation module 417 is described below in conjunction with FIG. 6. Let it suffice here to say that the rotation module includes a comparator detector (e.g., a TPOS detector) and at least portions of a precision rotation detector.

The magnetic field sensor 400 also includes a temperature sensor 420, preferably disposed on the same substrate as other circuits of the magnetic field sensor 400. The temperature sensor 420 is configured to generate a temperature signal 420a representative of a temperature experienced by the temperature sensor 420. An analog-to-digital converter (ADC) 422 is coupled to receive the temperature signal 420a and configured to generate a digital temperature signal 422a representative of the temperature signal 420a.

The magnetic field sensor 400 can include a segment processor 424 coupled to receive the digital temperature signal 422a. It will become apparent from discussion below that the segment processor 424 is configured to perform several functions. The segment processor 424 is configured to identify a temperature segment in which the digital temperature signal 422a, (i.e. the temperature signal 420a) falls. The segment processor 424 can also be coupled to receive a pair of gain correction coefficients 442a and/or a pair of offset correction coefficients 442b associated with the identified temperature segment. The pair of gain correction coefficients 442a and/or pair of offset correction coefficients 442b are associated with temperatures that bound the identified temperature segment. The pair of gain correction coefficients 442a and/or pair of offset correction coefficients 442b can be requested by the segment processor 424 via a control signal 426c.

The segment processor 424 can be configured to interpolate between the pair of gain correction coefficients 442a in accordance with the digital temperature signal 422a to generate a sensor gain correction value 430a. The gain control signal 416a can be an analog signal related to and determined by the sensor gain correction value 430a.

The segment processor 424 can also be configured to interpolate between the pair of offset correction coefficients 442b in accordance with the digital temperature signal 422a to generate a sensor offset correction value 432a. The offset control signal 418a can be an analog signal related to and determined by the sensor offset correction value 432a.

It will be understood that the segment processor 424 can be a digital circuit that process digital signals or values. The segment processor 424 controls gain and/or offset of the analog circuits described above.

The magnetic field sensor 400 can include an EEPROM 442 configured to hold a plurality of gain correction coefficients and/or a plurality of offset correction coefficients, the coefficients associated with temperature boundaries of a plurality of temperature segments. In some embodiments, there are five selected temperature boundaries, each associated with a respective gain correction coefficient (TDSense) and a respective offset correction coefficient (DQVO).

The plurality of gain correction coefficients and the plurality of offset correction coefficients can be stored in the EEPROM 442 at the time of manufacture of the magnetic field sensor 400, or at any time thereafter, via a signal 438a upon a communication link 438, which can be a serial communication link. A method of establishing the plurality of gain correction coefficients and the plurality of offset correction coefficients is described below in conjunction with FIG. 7.

The magnetic field sensor 400 can also include a user gain correction EEPROM 444 coupled to provide a user gain correction value 444a to the segment processor 424. The magnetic field sensor 400 can also include a user offset EEPROM 446 coupled to provide a user offset correction value 446a to the segment processor 424. The user gain EEPROM 444 can receive the user gain correction value 444a via a signal 438c upon the communication link 438. The user offset EEPROM 446 can receive the user offset correction value 446a via a signal 438d upon the communication link 438.

The magnetic field sensor 400 can also include a program control EEPROM 440 coupled to provide an interpolation control signal 440a to the segment processor 424. Interpolation control is described more fully below. The program control EEPROM 440 can receive the interpolation control signal 440a via a signal 438b upon the communication link 438.

The segment processor 424 can include an interpolation processor 426 coupled to receive the digital temperature signal 422a and coupled to receive the pair of gain correction coefficients 442a and/or the pair of offset correction coefficients 442b. In some embodiments, the interpolation processor 426 can also be coupled to receive the control signal 440a. The control signal 440a can determine a type of gain and/or offset interpolation to be performed by the interpolation processor 426. Types of interpolation are further described below.

The interpolation processor 426 is configured to generate an interpolated gain correction value 426a and/or an interpolated offset correction value 426b. To this end, the interpolation processor 426 is configured to identify the above-described temperature segment in which the digital temperature signal 422a, (i.e. the temperature signal 420a) falls. The interpolation processor 426 is also coupled to receive the above-described pair of gain correction coefficients 442a and/or the above-described pair of offset correction coefficients 442b associated with two temperatures that bound the identified temperature segment.

The interpolation processor 426 can use the digital temperature signal 422a to identify in which one of the plurality of temperature segments the measured temperature lies. Accordingly, the proper pair of gain correction coefficients 442a and/or the pair of offset correction coefficients 442b can be requested by the interpolation processor 426 by the control signal 426c.

The magnetic field sensor 400 can include a combining processor 428 coupled to receive the interpolated gain correction value 426a and/or the interpolated offset correction value 426b and coupled to receive the user gain correction value 444a and/or the user offset correction value 446a. The combining processor 428 is configured to combine the interpolated gain correction value 426a with the user gain correction value 444a and/or to combine the interpolated offset correction value 426b with the user offset correction value 446a. Accordingly, the combining processor 428 is configured to generate a combined gain correction value 428a and/or a combined offset correction value 428b, which can be stored in a gain adjust register 430 and an offset adjust register 432, respectively.

A digital-to-analog converter (DAC) 434 can be coupled to receive the stored gain correction value 430a and configured to generate a gain correction signal 434a received by a gain adjust circuit 416 configured to generate the gain control signal 416a accordingly. A DAC 436 can be coupled to receive the stored offset correction value 432a and configured to generate an offset correction signal 436a received by an offset adjust circuit 418 configured to generate the offset control signal 418a accordingly.

While the DACS 434, 436 are shown here, for embodiments described above in which various circuit functions are made in the digital domain, the DACS 434, 436 can be eliminated.

In one particular embodiment, the gain interpolation performed by the interpolation processor 426 to achieve the interpolated gain correction value 426a is a linear interpolation of the form:

$$SNS_{OUT} = \frac{CoeffB - CoeffA}{32} * temp[4:0] + CoeffA \quad (1)$$

where:
CoeffA and CoeffB are the pair of gain correction coefficients 442a bounding the identified temperature segment; and
temp[4:0] represents the five least significant bits of the digital temperature signal 422a, which can be a seven bit value.

In some embodiments, the interpolation processor 426 holds a plurality of gain (sensitivity) processing options and the processing option (the interpolation type, i.e., the equation above) is selected in accordance with the control signal 440a.

Some types of interpolation, e.g., higher order interpolations, may use more than two correction coefficients, and therefore, some embodiments store and use more than two gain and/or offset correction coefficients associated with each temperature segment.

In some embodiments, the combining processor 428 combines the interpolated gain correction value 426a with the user gain correction value 444a according to an equation below to, resulting in the combined gain correction value 428a:

$$SNS_{OUT} = \left[\left[\frac{CoeffB - CoeffA}{32} * temp[4:0] + CoeffA\right] * (SENS_{FINE} + K_{DEV})\right] - K_{DEV} \quad (2)$$

where:
$SENS_{FINE}$ is the user gain correction value 444a; and
KIEV is a device specific constant representative of a sensitivity of the particular type of magnetic field sensor (e.g., decimal 74 or decimal 206)

In one particular embodiment, the offset interpolation performed by the interpolation processor 426 to achieve the interpolated offset correction value 426b is a linear interpolation of the form:

$$QVO_{OUT} = \frac{CoeffB - CoeFFA}{32} * temp[4:0] + CoeffA \quad (3)$$

where:
CoeffA and CoeffB are the pair of offset correction coefficients 442b bounding the identified temperature segment; and
temp[4:0] represents the five least significant bits of the digital temperature signal 442a, which can be a seven bit value.

As described above, in some embodiments, the interpolation processor 426 holds a plurality of offset processing options and the processing option (the interpolation type, i.e., the equation above) is selected in accordance with the control signal 440a. In some embodiments the selection can select among the following linear interpolation types, each differing by a factor of two (a one bit shift).

$$QVO_{OUT} = \frac{\frac{CoeffB - CoeFFA}{32} * temp[4:0] + CoeffA}{2} \quad (4)$$

$$QVO_{OUT} = \frac{CoeffB - CoeffA}{32} * temp[4:0] + CoeffA \quad (5, \text{same as } 3)$$

$$\left[\frac{CoeffB - CoeffA}{32} * temp[4:0] + CoeffA\right] * 2 \quad (6)$$

In some embodiments, the combining processor 428 combines the interpolated offset correction value 426b with the user offset correction value 446a according to an equation below, resulting in the combined offset correction value 428b:

$$QVO_{OUT} = \frac{CoeffB - CoeFFA}{32} * temp[4:0] + CoeffA + QVO \quad (7)$$

where: QVO is the user offset correction value 446a.

It should be apparent from the above gain and offset equations that the user gain correction value 444a is applied in a product and the user offset correction value 446a is applied in a sum, as would be expected.

Figure 5:
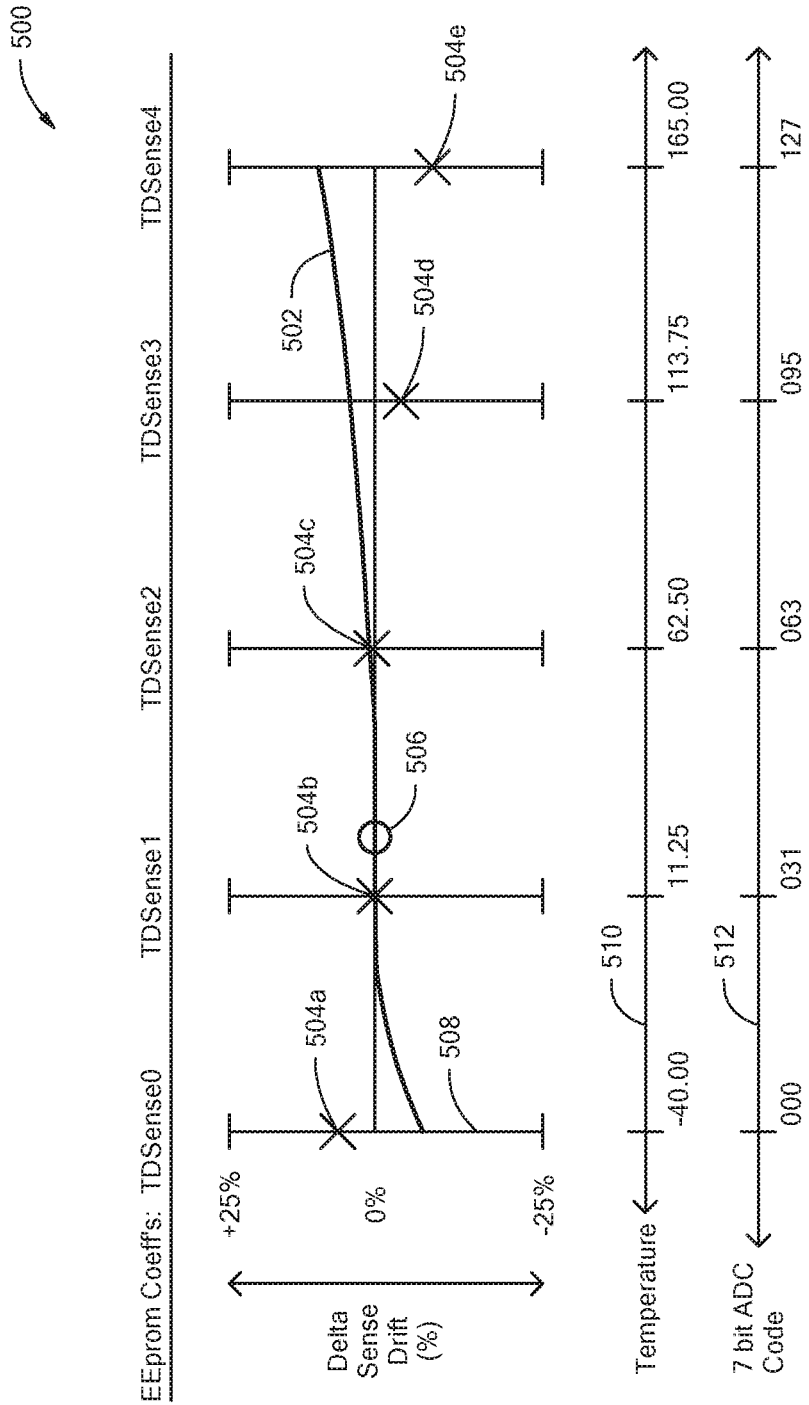
FIG. 5 is a graph showing an exemplary characteristic curve of sensitivity versus temperature of a magnetic field sensor and showing gain correction coefficients.

Referring now to FIG. 5, a graph 500 has a vertical axis 508 with a scale in units of sensitivity change in percent. A first horizontal axis 510 has a scale in units of temperature in degrees Celsius experienced by a magnetic field sensor (i.e., by the temperature sensor 420 of FIG. 4) and a second horizontal axis 512 has a scale in units corresponding to a seven bit digital code representative of temperature, but in decimal units from zero to one hundred twenty seven. The axis 512 corresponds to the digital temperature signal 422a of FIG. 4.

A characteristic curve 502 is representative of a relative sensitivity (relative to sensitivity at room temperature 506) of a magnetic field sensor having no gain correction values applied. It can be seen that the relative sensitivity represented by the characteristic curve 502 tends to be lower at low and tends to be higher at high temperatures.

At a first temperature, −40 degrees Celsius, a gain correction coefficient 504a (TDSense0 (FIG. 4)) is opposite from the relative sensitivity drop of the characteristic curve 502. It will be understood that the gain correction coefficient 504a can be applied to the magnetic field sensor when the magnetic field sensor experiences the temperature of −40 degrees, resulting in essentially no sensitivity change from the sensitivity at room temperature 506. Similarly, other gain correction coefficients 504b, 504c, 504d, 504e (TDSense1, TDSense2, TDSense3, TDSense4, respectively (FIG. 4)) can be applied at other temperatures with which they are associated (11.25, 62.5, 113.75, 165.00 degrees Celsius, respectively) in order to provide no sensitivity change from the sensitivity at room temperature 506 at those particular temperatures.

Five temperature segments are shown, namely −40.00 to 11.25, 11.25 to 62.5, 62,5 to 113.75, and 113.75 to 165.00 degrees Celsius.

Within any temperature segment, e.g., the temperature segment 11.25 to 62.5, identified in accordance with an actual measured temperature experienced by the magnetic field sensor as represented by the digital temperature signal 422a of FIG. 4, the interpolation processor 426 (FIG. 4) can interpolate between the gain correction coefficients (e.g., 504b, 504c) associated with boundaries of the identified temperature segment to establish an interpolated gain correction value (e.g., 426a, FIG. 4) to be used at the particular measured temperature. The interpolated gain correction value can be applied to the magnetic field sensor 400 to keep the sensitivity of the magnetic field sensor essentially unchanged from the sensitivity at room temperature 506.

As shown and described above, the sensitivity interpolation can be a linear interpolation. However in other embodiments, the gain interpolation can be of another form, for example, a quadratic interpolation, or any other form of non-linear interpolation.

While five gain correction coefficients 504a-504e are shown and four associated temperature segments, in other embodiments, there can be more than five or fewer than five gain correction coefficients and more than four or fewer than four associated temperature segments. The number of gain correction coefficients and associated temperature segments can be selected according to a desired accuracy and according to a desired largest physical size of the EEPROM 442 (FIG. 4) that stores the gain correction coefficients. In general, the greater the number of gain correction coefficients that are stored in the EEPROM 442, the more accurate will be the interpolated gain correction coefficients and the more accurate will be the corrected relative sensitivity of the magnetic field sensor.

While the temperature segments are shown to be equal in numbers of degrees, in other embodiments, the temperature segments can have an unequal number of degrees. For example, in some embodiments, temperature segments near to room temperature 506 can have a larger (or smaller) temperature span than temperature segments further from room temperature 106.

Each individual magnetic field sensor of a particular type can have different gain correction coefficients 504a-504e generated by a process more fully described below in conjunction with FIG. 7. However, in some embodiments, each one of a particular type of magnetic field sensor can have the same gain correction coefficients 504a-504e.

As further described below in conjunction with FIG. 7, some of (or all of) the gain correction coefficients 504a-504e can be selected (i.e., measured) during production of the magnetic field sensor (or thereafter) by direct measurements of relative sensitivity at the plurality of temperatures of the specific one of the magnetic field sensors in which the specific gain correction coefficients 504a-504e are stored. However in some embodiments, fewer than all of the gain correction coefficients 504a-504e result from direct measurements and other ones of the gain correction coefficients 504a-504e are derived from the shape of the sensitivity characteristic curve 502. In other words, for example, the gain correction coefficient 504a can be generated by a relative sensitivity measurement at −40.00 degrees and at room temperature 506, and other ones of the gain correction coefficients 504b-504e can be deduced by knowledge of a shape of the sensitivity characteristic curve 502.

The characteristic curve 502 as shown can be representative of an average sensitivity characteristic taken from a plurality of the same type of magnetic field sensor. Other types of magnetic field sensors can have characteristic curves with other shapes.

In using the characteristic curve 502 to derive some (or all) of the gain correction coefficients 504a-504e for a particular magnetic field sensor, it should be understood that the characteristic curve 502 can keep the same shape common to all of the same type of magnetic field sensors, but can be scaled up or down in magnitude for each individual magnetic field sensor of the same type. For example, if the relative sensitivity of an individual magnetic field sensor is measured at room temperature and also at −40 degrees, and if the relative sensitivity at −40 degrees is lower than that represented by the characteristic curve 502, it can be presumed that the characteristic curve of the magnetic field sensor being measured curves more downward at −40 degrees and more upward at 165 degrees, but otherwise maintains the same shape. Thus, by making only a room temperature sensitivity measurement and also a relative sensitivity measurement at any other temperature (relative to sensitivity at room temperature), a characteristic curve similar to (same shape as) the characteristic curve 502 (but with different scaling) can be derived and the other gain correction coefficients can be deduced.

It will be understood that the particular shape of the sensitivity characteristic curve 502 depends upon the particular type magnetic field sensor. Furthermore, the characteristic curve 502 can be slightly different (scaling) for different specific ones of the particular type of magnetic field sensor. Therefore, it may be advantageous to characterize a plurality of different specific ones of the particular type of magnetic field sensor, and take an average in order to identify the shape of the characteristic curve 502, which can thereafter be scaled up or down to suit each individual magnetic field sensor of the same type.

Figure 6:
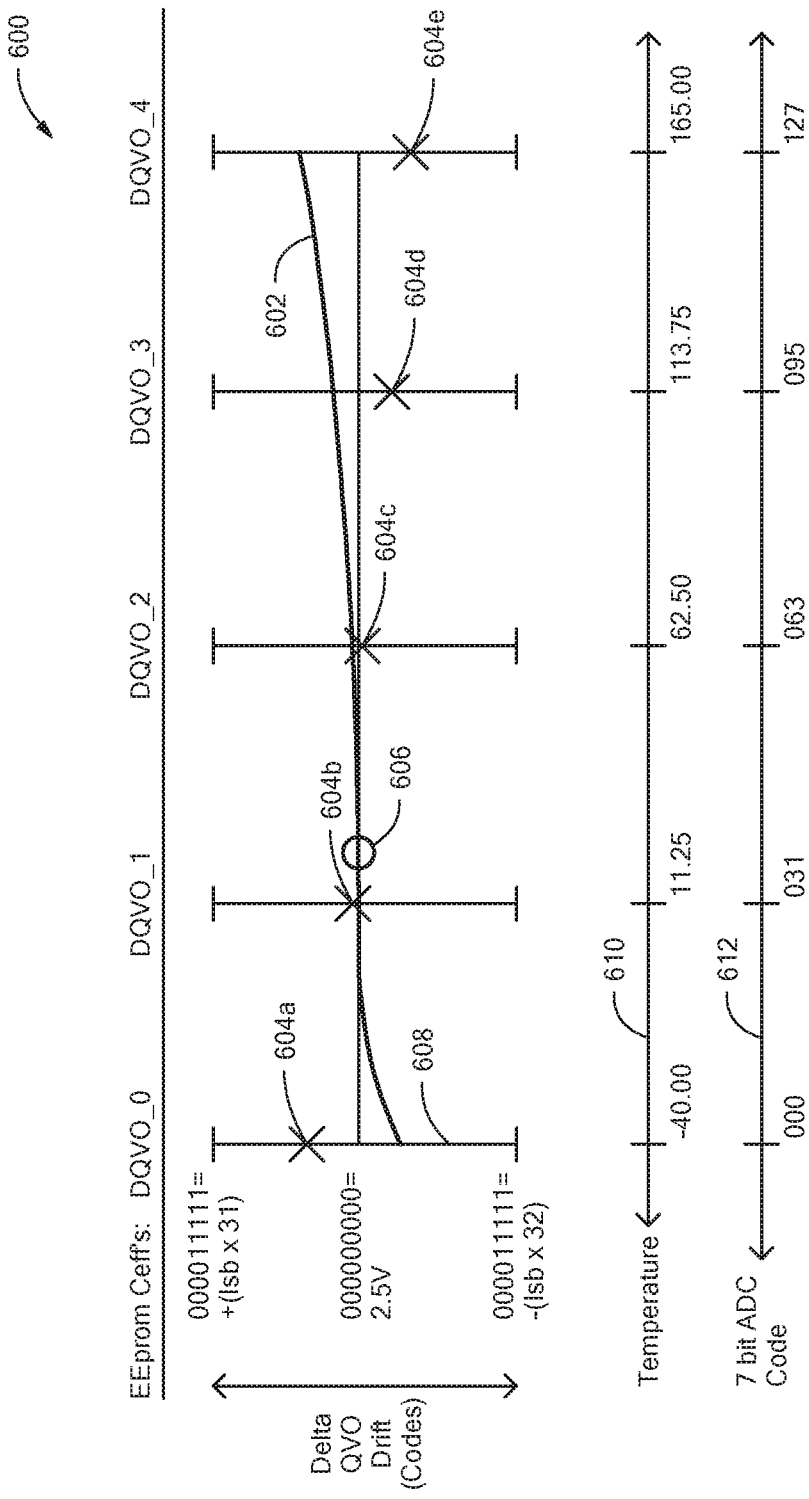
FIG. 6 is a graph showing an exemplary characteristic curve of offset versus temperature of a magnetic field sensor and showing offset correction coefficients.

Referring now to FIG. 6, a graph 600 has a vertical axis 608 with a scale in units of DC offset voltage change in linear units represented by a nine bit digital value. A first horizontal axis 610 has a scale in units of temperature in degrees Celsius experienced by a magnetic field sensor (i.e., by the temperature sensor 420 of FIG. 4) and a second horizontal axis 612 has a scale in units corresponding to a seven bit digital code representative of temperature, but in decimal units from zero to one hundred twenty seven. The axis 612 corresponds to the digital temperature signal 422a of FIG. 4.

A characteristic curve 602 is representative of a relative offset (relative to offset at room temperature 606) of a magnetic field sensor having no offset correction values applied. It can be seen that the offset represented by the characteristic curve 602 tends to be in one direction at low temperatures relative to the offset (nominally 0.0V) at room temperature and tends to be in the other direction at high temperatures relative to the offset at room temperature.

At a first temperature, −40 degrees Celsius, an offset correction coefficient 604a (DQVO_0 (FIG. 4)) is opposite from the relative offset drop of the characteristic curve 602. It will be understood that the offset correction coefficient 604a can be applied to the magnetic field sensor when the magnetic field sensor experiences the temperature of −40 degrees, resulting in essentially no offset change from the offset (0.0V) at room temperature 606. Similarly, other offset correction coefficients 604b, 604c, 604d, 604e (DQVO_1, DQVO_2, DQVO_3, DQVO_4, respectively (FIG. 4)) can be applied at other temperatures with which they are associated (11.25, 62.5, 113.75, 165.00 degrees Celsius, respectively) in order to provide no offset change from the offset at room temperature 606 at those particular temperatures.

As in FIG. 5, five temperature segments are shown, namely −40.00 to 11.25, 11.25 to 62.5, 62,5 to 113.75, and 113.75 to 165.00 degrees Celsius.

Within any temperature segment, e.g., the temperature segment 11.25 to 62.5, identified in accordance with an actual measured temperature experienced by the magnetic field sensor as represented by the digital temperature signal 422a of FIG. 4, the interpolation processor 426 (FIG. 4) can interpolate between the offset correction coefficients (e.g., 604b, 604c) associated with boundaries of the temperature segment to establish an interpolated offset correction value (e.g., 426b, FIG. 4) to be used at the particular measured temperature. The interpolated offset correction value can be applied to the magnetic field sensor to keep the offset of the magnetic field sensor essentially unchanged from the offset at room temperature 606.

As shown and described above, the offset interpolation can be a linear interpolation. However in other embodiments, the offset interpolation can be of another form, for example, a quadratic interpolation, or any other form of non-linear interpolation.

While five offset correction coefficients 604a-604e are shown and four associated temperature segments, in other embodiments, there can be more than five or fewer than five offset correction coefficients and more than four or fewer than four associated temperature segments. The number of offset correction coefficients and associated temperature segments can be selected according to a desired offset accuracy and according to a desired largest physical size of the EEPROM 442 (FIG. 4) that stores the offset correction coefficients. In general, the greater the number of offset correction coefficients that are stored in the EEPROM 442, the more accurate will be the interpolated offset correction coefficients and the more accurate will be the corrected relative offset of the magnetic field sensor.

While the temperature segments are shown to be equal in numbers of degrees, in other embodiments, the temperature segments can have an unequal number of degrees. For example, in some embodiments, temperature segments near to room temperature 606 can have a larger (or smaller) temperature span than temperature segments further from room temperature 606.

Each individual magnetic field sensor of a particular type can have different offset correction coefficients 604a-604e generated by a process more fully described below in conjunction with FIG. 7. However, in some embodiments, each one of a particular type of magnetic field sensor can have the same offset correction coefficients 604a-604e.

As further described below in conjunction with FIG. 7, some of (or all of) the offset correction coefficients 604a-604e can be selected (i.e., measured) during production of the magnetic field sensor (or thereafter) by direct measurements of relative offset at the plurality of temperatures of the specific one of the magnetic field sensors in which the specific offset correction coefficients 604a-604e are stored. However in some embodiments, fewer than all of the offset correction coefficients 604a-604e result from direct measurements and other ones of the offset correction coefficients 604a-604e are derived from the offset characteristic curve 602. In other words, for example, the offset correction coefficient 604a can be generated by a relative offset measurement at −40.00 degrees and at room temperature 606, and other ones of the offset correction coefficients 604b-604e can be deduced by knowledge of a shape of the offset characteristic curve 602.

The characteristic curve 602 as shown can be representative of an average offset characteristic taken from a plurality of the same type of magnetic field sensor. Other types of magnetic field sensors can have offset characteristic curves with other shapes.

In using the offset characteristic curve 602 to derive some (or all) of the offset correction coefficients 604a-604e for a particular magnetic field sensor, it should be understood that the offset characteristic curve 602 can keep the same shape common to all of the same type of magnetic field sensors, but can be scaled up or down in magnitude for each individual magnetic field sensor of the same type. For example, if the relative offset of an individual magnetic field sensor is measured at room temperature and also at −40 degrees, and if the relative offset at −40 degrees is lower than that represented by the characteristic curve 602, it can be presumed that the characteristic curve of the magnetic field sensor being measured curves more downward at −40 degrees and more upward at 165 degrees, but otherwise maintains the same shape. Thus, by making only a room temperature offset measurement and also a relative offset measurement at any other temperature (relative to offset at room temperature), a characteristic curve similar to (same shape as) the characteristic curve 602 (but with different scaling) can be derived and the other offset correction coefficients can be deduced.

It will be understood that the particular shape of the offset characteristic curve 602 depends upon the particular type magnetic field sensor. Furthermore, the characteristic curve 602 can be slightly different (e.g., different scaling) for different specific ones of the particular type of magnetic field sensor. Therefore, it may be advantageous to characterize a plurality of different specific ones of the particular type of magnetic field sensor, and take an average in order to identify the shape of the offset characteristic curve 602, which can thereafter be scaled up or down to suit each individual magnetic field sensor of the same type.

From the above examples of FIGS. 5 and 6, it can be seen that in one embodiment, there are five gain correction coefficients associated with five temperatures and, five offset correction coefficients associated with the same five temperatures. However, the gain correction coefficients and the offset correction coefficients need not be associated with the same temperatures. The EEPROM 442 of FIG. 4 is shown to store the exemplary five gain correction coefficients (TDSense0 to TDSense4) and the five exemplary offset correction coefficients (DQVO_0 to DQVO_4).

It should be appreciated that FIGS. 7 and 10 below show flowcharts corresponding to the below contemplated techniques which would be implemented in the magnetic field sensor 400 (FIG. 4). Rectangular elements (typified by element 704 in FIG. 7), herein denoted "processing blocks," represent computer software instructions or groups of instructions. Diamond shaped elements (typified by element 1004 in FIG. 10), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Figure 7:
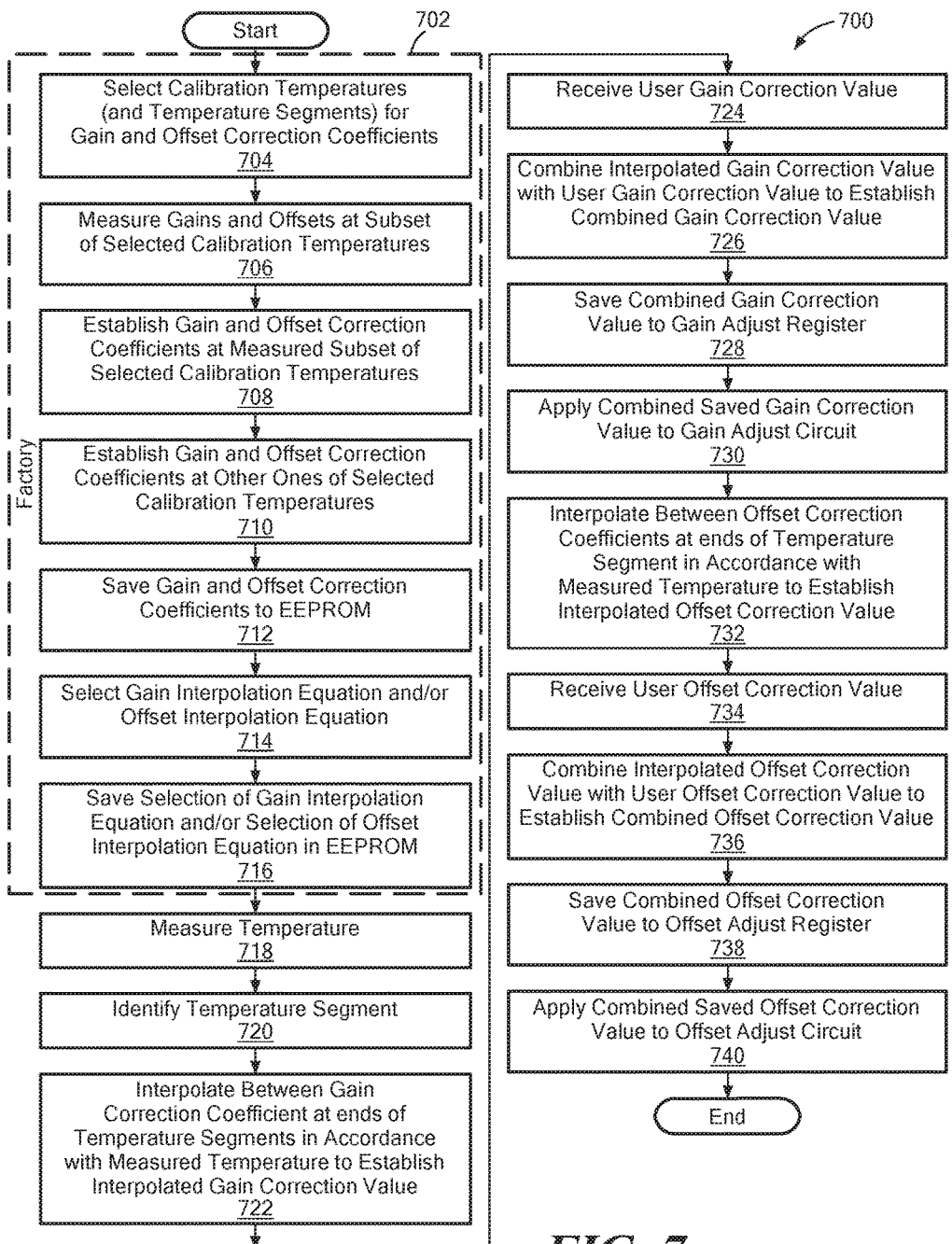
FIG. 7 is a flow chart showing a process to correct gain and/or offset versus temperature of the magnetic field sensor of FIG. 4.

Referring now to FIG. 7, an exemplary method 700 begins at a set of blocks 702 that can be performed in a factory upon manufacture of the magnetic field sensor 10 of FIG. 1. At block 704, a set of calibration temperatures and associated temperature segments are selected. In the examples given above in conjunction with FIGS. 4-6, there can be five selected temperatures, e.g., −40.00, 11.25, 62.5, 113.75, and 165.00 degrees Celsius and four associated temperature segments bounded by adjacent pairs of the selected temperatures. However, as described above there can be more than five or fewer than five selected temperatures and more than four or fewer than four associated temperature segments, and the selected temperatures need not be evenly spaced.

At block 706, relative gains and relative offsets (relative to gain and offset at room temperature) can be measured either at all of the selected temperatures, or at a subset of the selected temperatures, for example, only at −40.00 degrees Celsius.

At block 708, based upon the relative sensitivity measurement(s), gain and offset correction coefficients are established for the temperature(s) at which measurements were taken. The gain and offset correction coefficients can be opposite from the measured relative sensitivity and relative offset deviations.

At block 710, other gain and offset correction coefficients can be established for the selected temperatures at which direct measurements of relative sensitivity and offset are not taken for the specific magnetic field sensor under consideration. As described above, the establishment of the other gain and offset correction coefficients can be made in accordance with generation of a sensitivity characteristic curve and/or an offset characteristic curve, using knowledge of the shape of the curves as derived from an average of measurements of a plurality of magnetic field sensors of the same type. Using the same shape, the sensitivity (gain) characteristic curve and the offset characteristic curve can have the same shape as the average of the measurements, but can be scaled up or down in magnitude according to the sensitivity and offset measurement(s) made block 706.

At block 712, the gain and offset correction coefficients (e.g., five gain correction coefficients and five offset correction coefficients) are stored within the magnetic field sensor, for example, within the EEPROM 442 of FIG. 4 via a serial communication link, for example, the communication link 438 of FIG. 4.

At block 714, in some embodiments, a gain interpolation equation and/or an offset interpolation type (equation) can be selected from among a plurality of interpolation types. See equations 1, 3, 4, and 5 above.

At block 716, the selection of the interpolation types can be saved as a value, for example, in the EEPROM 440 of FIG. 4 via the serial communication link, for example, the communication link 438 of FIG. 4.

The remaining blocks of the process 700 can be performed by the magnetic field sensor when in the field in normal operation, either continuously or from time to time.

At block 718, the magnetic field sensor measures its temperature, for example, via the temperature sensor 420 of FIG. 4.

At block 720, the magnetic field sensor identifies in which one of the temperature segments selected at block 704 the measured temperature resides.

At block 722, the magnetic field sensor, for example, the interpolation processor 426 of FIG. 4, interpolates, in accordance with the measured temperature, between gain correction coefficients stored at block 712 that bound the identified temperature segment. An interpolated gain correction value (e.g., 426a of FIG. 4) is thus established. The interpolation can be in accordance with equation 1 above.

At block 724 or earlier, the magnetic field sensor can receive a user gain correction value, for example the value 444a stored in the user gain correction value EEPROM 444 of FIG. 4 via the communication link 438 of FIG. 4. In some embodiments, the user gain correction value is used to merely adjust a sensitivity of the magnetic field sensor between factors of 0.75 and 1.25 according to user preference.

At block 726, the interpolated gain correction value is combined with the user gain correction value (e.g., by the combining processor 428 of FIG. 4) to establish a combined gain correction value (e.g., 428a of FIG. 4).

At block 728, the combined gain correction value is stored, for example, in the gain adjust register 430 of FIG. 4.

At block 730 the saved gain correction value is applied to the magnetic field sensor to adjust its sensitivity (i.e., gain) via the DAC 434 and the gain adjust circuit 416 of FIG. 4.

At block 732, the magnetic field sensor, for example, the interpolation processor 426 of FIG. 4, interpolates, in accordance with the measured temperature, between offset correction coefficients stored at block 712 that bound the identified temperature segment. An interpolated offset correction value (e.g., 426b of FIG. 4) is thus established. The interpolation can be in accordance with equation 3 above.

At block 734 or earlier, the magnetic field sensor can receive a user offset correction value, for example the value 446a stored in the user offset correction value EEPROM 446 of FIG. 4 via the communication link 438 of FIG. 4.

At block 736, the interpolated offset correction value is combined with the user offset correction value (e.g., by the combining processor 426 of FIG. 4) to establish a combined offset correction value (e.g., 428b of FIG. 4).

At block 738, the combined offset correction value is stored, for example, in the offset adjust register 432 of FIG. 4.

At block 740, the saved offset correction value is applied to the magnetic field sensor to adjust its offset via the DAC 436 and the offset adjust circuit 418 of FIG. 4.

With the above-described technique, the magnetic field sensor can maintain a sensitivity and an offset that do not change or that change very little with respect to temperature of the magnetic field sensor compared to the sensitivity and offset of the magnetic field sensor at room temperature.

Because the sensitivity and the offset have been stabilized with respect to temperature by the above-described circuits and techniques, it will be appreciated that thresholds described below, which are derived from the signal 414a of FIG. 4 by the rotation module 417 of FIG. 4 are also stabilized with respect to temperature. However, it should also be understood that, an air gap between the magnetic field sensor 402 and the gear 450 of FIG. 4 can be different from installation to installation, or can change with time, for example, due to mechanical wear or the like. Therefore, the magnitude of the signal 414a can still change with respect to air gap dimensions, and thresholds described below, which are derived from the signal 414a can still change or be different due to air gap changes or differences.

Figure 8:
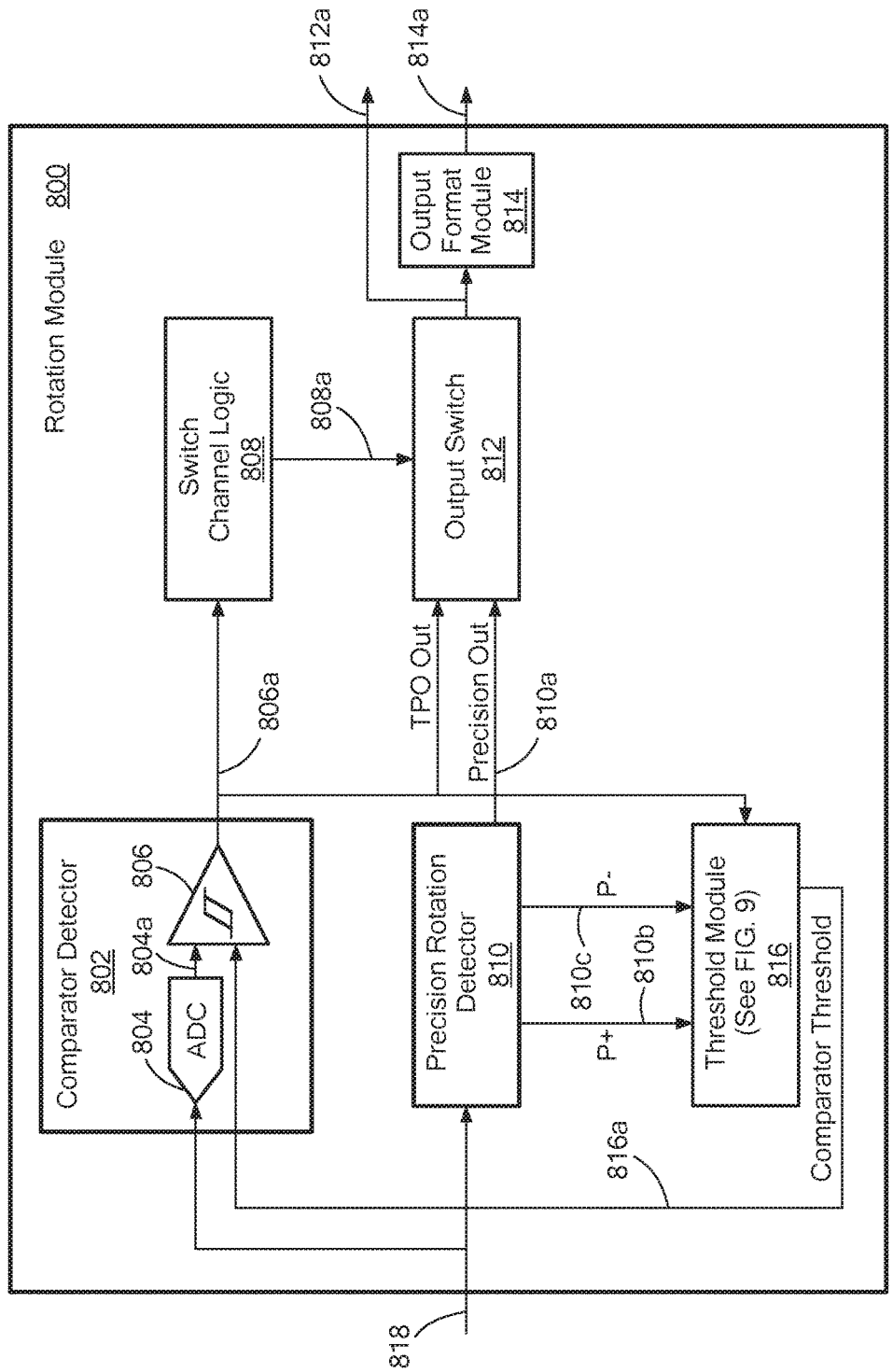
FIG. 8 is a block diagram showing further details of the rotation module of the magnetic field sensor of FIG. 4 and showing a threshold module.

Referring now to FIG. 8, a rotation module 800 can be the same as or similar to the rotation module 417 of FIG. 4. The rotation module 800 is coupled to receive a signal 818, which can be the same as or similar to the signal 414a of FIG. 4. As described above, a magnitude of the signal 414, and of the signal 818, are stabilized with respect to temperature, but can change with respect to mechanical considerations, for example, air gap.

The rotation module 800 can include two different types of rotation detectors, for example, a comparator detector 802 and a precision rotation detector 810.

It will be understood that the comparator detector 802, in some embodiments, can operate as a true power on state (TPOS) detector. In particular, typically where one magnetic field sensor is used as shown above in conjunction with FIG. 4, the comparator detector 802 is operable as a tooth detector (as opposed to an edge detector), and therefore, provides a TPOS function, able to distinguish a tooth in the gear 450 (FIG. 4) from a valley, even when the gear 450 is not rotating.

However, in other embodiments, a magnetic field sensor similar to the magnetic field sensor 400 of FIG. 4 can use two or more magnetic field sensing elements coupled in a differential arrangement. These embodiments provide an edge detector (as opposed to a tooth detector), not capable of distinguishing a tooth from a valley when the gear 450 is not rotating, and therefore, do not provide a TPOS function.

For these embodiments, the comparator detector 802 is not a TPOS detector, but can still be of the form shown and described herein.

In view of the above, it will be understood that the comparator detector 802 can be operable as a tooth detector (E.g., a TPOS detector) or as an edge detector, depending upon the arrangement of magnetic field sensing element(s) (e.g., 402, FIG. 4). Therefore, as used herein, the term "comparator detector" is used to describe and circuit detector that includes a comparator operable to receive a comparator threshold, and to compare a signal with the comparator threshold.

The comparator detector 802 essentially has a rapid startup at which time it provides an accurate comparator detector output signal 806a, while precision rotation detector 810 takes longer to start up and to provide an accurate precision rotation detector output signal 810a.

Precision rotation detectors of a variety of types are known. Some precision rotation detectors internally provide a positive peak signal 810b representative of amplitudes of positive peaks of the signal 818 and a negative peak signal 810c representative of negative peaks of the signal 818. Between the peaks, positive peak signal 810b and the negative peak signal 810c can hold values representative of amplitudes of the peaks. Thus, in many conventional arrangements the positive peak signal 810b and the negative peak signal 810c have stepped type characteristics achieving and holding respective peaks of the input signal 818.

The comparator detector 802 can include a comparator 806, which can be either an analog comparator or a digital comparator. The comparator 806 is coupled to receive a comparator threshold 816a (e.g., TPOS threshold) generated by a threshold module 816, described more fully below in conjunction with FIG. 9.

An output switch 812 can be coupled to receive the comparator detector output signal 806a and the precision rotation detector output signal 810a. By way of a control signal 808a generated by a switch change logic module 808, the rotation module 800 generates as a rotation output signal 812a representative of a selected one of the comparator detector output signal 806a or the precision rotation detector output signal 810a. The rotation output signal 812a can be a two state output signal for which a high state is indicative of one of the teeth of the gear 450 of FIG. 4 being proximate to the magnetic field sensing element 402, and for which a low state is indicative of one of the valleys of the gear 450 being proximate to the magnetic field sensing element 402. However, in other embodiments, states of the rotation output signal 812a can be reversed from those described above.

It will be appreciated that the rotation output signal 812a can be representative of rotation of the gear 450, and also can be representative of speed of rotation of the gear 450. In some embodiments, the rotation output signal 812a can also be representative of a direction of rotation of the gear 450. Magnetic field sensors, i.e., rotation detectors, that provide the rotation output signal 812a that is also indicative of the direction of rotation are known Exemplary arrangements can be found in U.S. Pat. No. 6,815,944, issued Nov. 9, 2004, U.S. Pat. No. 7,026,808, issued Apr. 11, 2006, U.S. Pat. No. 7,772,838, issued Apr. 29, 2008, U.S. Pat. No. 7,592,801, issued Sep. 22, 2009, U.S. Pat. No. 7,622,914, issued Nov. 24, 2009, U.S. Pat. No. 7,772,838, and U.S. Pat. No. 7,253,614, issued Aug. 7, 2007, all of which patents are incorporated by reference herein in their entirety, and all of which patents are assigned to the assignee of the present invention.

The rotation output signal 812*a* can be the same as or similar to the output signal 417*a* of FIG. 4. In some embodiments, the rotation output signal 812*a* is the only output signal from the magnetic field sensor 400 of FIG. 4.

In some embodiments, the rotation module 800 can include an output format module 814 coupled to receive the rotation signal 812*a* and configured to provide a formatted rotation output signal 814*a*. Like the rotation output signal 812*a*, the formatted rotation output signal 814*a* can also be indicative of at least one of a rotation, a speed of rotation, or a direction of rotation of the gear 450 of FIG. 4. The formatted rotation output signal 814*a* can be provided in one of a variety of formats, for example, a SENT format, a CAN format, or an I2C format. Other formats are also possible.

In some other embodiments, the rotation module 800 does not include the switch change logic 808 or the output switch 812, and the comparator detector output signal 806*a* is used as the rotation output signal from the rotation module 800 at all times. For these embodiments, the precision rotation detector output signal 810*a* may not be generated. In other words, the precision rotation detector 810 can be used to generate only the positive and negative peak signals 810*b*, 810*c*, or only one of the positive or negative peak signals 810*b*, 810*c*.

Figure 9:
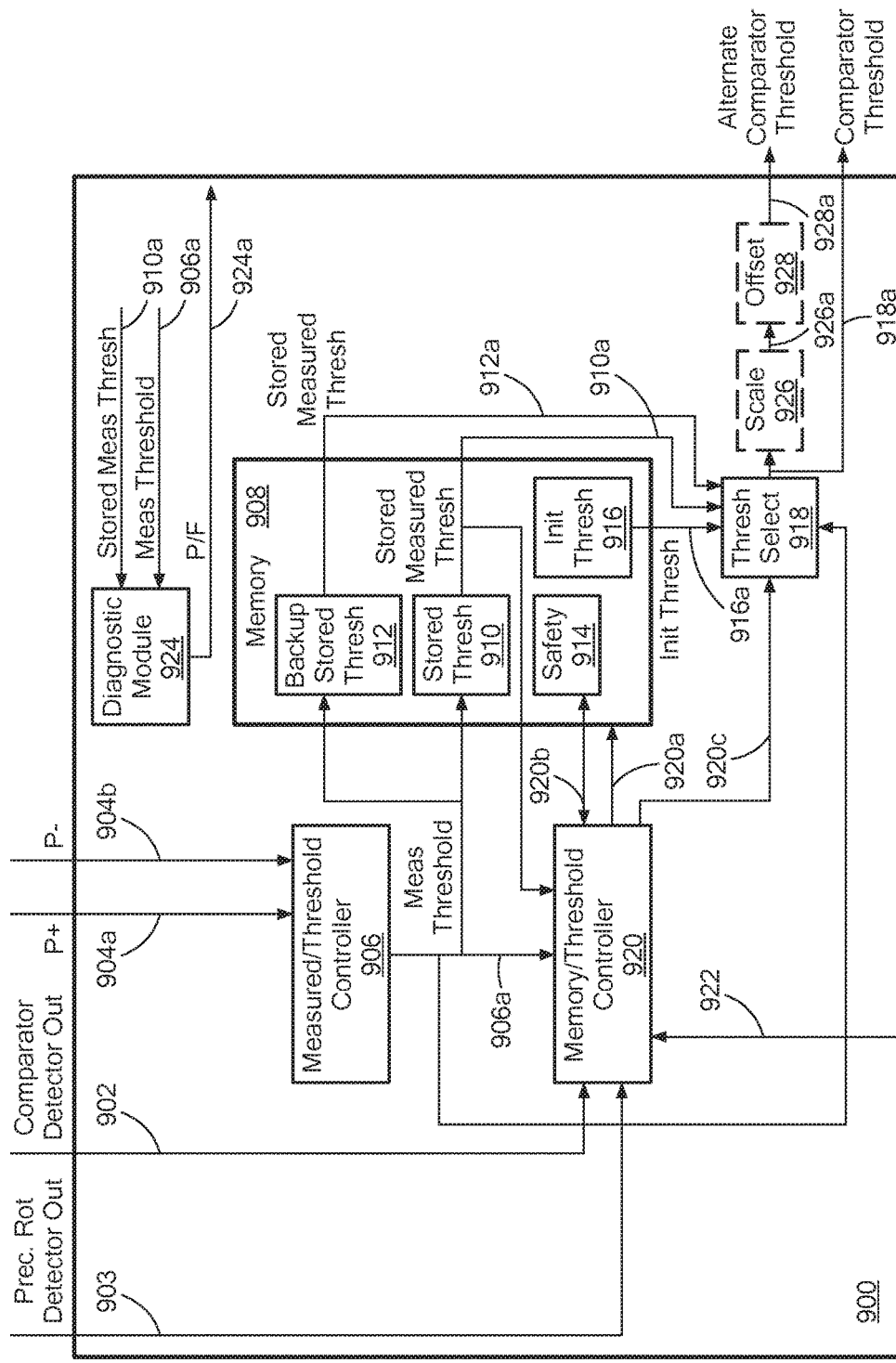
FIG. 9 is a block diagram showing an exemplary threshold module that can be used as the threshold module of FIG. 8 and having a measured threshold module to generate a measured threshold value and a memory device to store the measured threshold value.

Referring now to FIG. 9, a threshold module 900 can be the same as or similar to the threshold module 816 of FIG. 8. The threshold module 900 can include a measured threshold module 906 coupled to receive positive and negative peak signals 904*a*, 904*b*, respectively. The positive and negative peak signals 904*a*, 904*b* can be the same as or similar to the positive and negative peak signals 810*b*, 810*c* of FIG. 8, and can similarly be indicative of magnitudes of positive peaks (P+) and negative peaks (P−) of the temperature controlled signal 414*a* of FIG. 4.

The measured threshold module 906 is configured to generate a measured threshold value 906*a*. For reasons described above in conjunction with FIG. 4, the measured threshold value 906*a* is stable with respect to temperature, but can still change, for example, in accordance with electrical noise, and/or in accordance with changes of the air gap between the gear 450 and the magnetic field sensing element 402 of FIG. 4.

As used herein, the term "signal" is used to describe an analog or digital voltage or current time waveform. As used herein, the term "value" is used to describe an amplitude and/or offset characteristic of an analog or digital signal at a point in time. As used herein, the term "value" is also used to describe a result of a calculation at a point in time involving the amplitude and/or offset characteristic of the analog or digital signal.

The measured threshold module 906 can calculate the measured threshold value 906*a* as a combination of the positive and negative peak signals 904*a*, 904*b*. For example, the measured threshold value 906*a* can be a value representative of a predetermined percentage, for example, seventy percent, of a voltage difference between the positive and negative peak signals 904*a*, 904*b*. A new measured threshold value 906*a* can be calculated from time to time, or can be calculated when either one or both of the positive peak signal 904*a* or the negative peak signal 904*b* change in value.

In some other embodiments, the measured threshold module 906 is coupled to receive only one of the positive peak signal 904*a* or the negative peak signals 904*b*, in which case, the measured threshold value 906*a* is calculated based only upon the received one of the signals. For example, the measured threshold value 906*a* can be a value representative of a predetermined percentage, for example, ten percent, of the positive peak signal 904*a*.

The threshold module 900 can also include a memory device 908, which can be in nonvolatile memory device, for example, an EEPROM.

The memory device 908 can include a stored threshold memory region 910 coupled to receive and to store the measure threshold value 906*a*. The measured threshold value 906*a* can be stored in the memory device 908 at a plurality of storage times, but, in particular, at a storage time either at or immediately prior to a power down of the magnetic field sensor 400 of FIG. 4. Storage and storage times are described more fully below.

A stored measured threshold value 910*a* can be provided by the memory stored threshold memory region 910. In this way, upon powering up again, the magnetic field sensor 400 can use a stored measured threshold value 910*a* in the comparator detector 802 of FIG. 8 immediately upon powering up.

A backup memory region 912 can store one or more backup values of the measured threshold value 906*a*. The backup memory region 912 can store the measured threshold value 906*a* at different times than the stored threshold memory region 910 stores the measured threshold value 906*a*. With the backup arrangement, the threshold module 900 is able to reliably store the measured threshold value in either the backup memory region 912 or in the measured threshold memory region 910, avoiding at least one of the memory regions at a time when the magnetic field sensor 400 of FIG. 4 is powering down, during which time storage may be unreliable.

The memory device 908 can also include an initial threshold memory region 916 configured to store a predetermined initial threshold value, and configured to provide a stored predetermined initial threshold value 916*a*. It should be understood that the magnetic field sensor 400 of FIG. 4 must-have a starting point for the comparator threshold 816*a* of FIG. 8 the very first time that the magnetic field sensor 400 first powers up. The stored initial predetermined threshold value 916*a* is used for this purpose.

The memory device 908 can also include a safety word storage area 914 configured to store a digital bit or digital word indicative of a time when storage is ongoing in the stored threshold memory region 910. The stored bit or word can be indicative of an ongoing storage into an indicated one of the stored threshold memory region 910 and the backup stored threshold region 912.

A threshold selection module 918 can be coupled to receive the initial threshold value 916*a*, and at least one of the measured threshold value 906*a*, the stored measured threshold value 910*a*, or the stored backup measured threshold value 912*a*. The threshold selection module 918 is configured to generate a comparator threshold signal 918*a* as a selected one of the initial threshold value 916*a*, the measured threshold value 906*a*, the stored measured threshold value 910*a*, or the stored backup measured threshold value 912*a*.

A memory/threshold controller 920 is coupled to control the memory device 908 by way of a control line 920*a*, controlling when storage of the measured threshold value 906*a* occurs. The memory/threshold controller 920 can also provide a control line 920*c*, which controls the selection of which one of the initial threshold value 916*a*, the stored measured threshold value 910*a*, or the stored backup measured threshold value 912*a* is provided as the comparator threshold value 918*a*.

The memory/threshold controller 920 can be coupled to receive one or more of a variety of signals, for example, the stored measured threshold value 910a, the measured threshold value 906a, a power on-off signal 922 representative of a power on or a power off of the magnetic field sensor 400 of FIG. 4, a comparator detector output signal 902, which can be the same as or similar to the comparator detector output signal 806a of FIG. 8, or a precision rotation detector output signal 903, which can be the same as or similar to the precision rotation detector output signal 810a of FIG. 8.

In operation, the memory/threshold controller 920 can use the various inputs signals in a variety of ways to control the storage of the measured threshold value 906a into the memory device 908, and to control the threshold selection module 918.

With regard to storage of the measured threshold value 906a into the memory device 908, in one embodiment, the memory/threshold controller can cause the storage only when the measured threshold value 906a changes by a predetermined amount, which amount can be zero or more.

In another embodiment, the memory/threshold controller 920 can cause the storage only when the measured threshold value 906a differs from the stored measured threshold value 910a by a predetermined amount, which amount can be zero or more.

In another embodiment, the memory/threshold controller 920 can cause storage whenever the power on/off signal 922 first becomes indicative of the power off condition of the magnetic field sensor 400 of FIG. 4. For these embodiments, it is presumed that the magnetic field sensor 400 of FIG. 4 is coupled to some charge storage device, for example, a capacitor, such that the magnetic field sensor 400 does not instantaneously power off.

In another embodiment, the memory/threshold controller 920 can cause the storage only when the comparator detector output signal 902 has changed state by a predetermined number of times after the magnetic field sensor 400 of FIG. 4 has powered on. It will be understood that, these embodiments allow the precision rotation detector 810 of FIG. 8 to achieve a stable positive peak signal 810b and a stable negative peak signal 810c.

In another embodiment, the memory/threshold controller 920 can cause the storage when the previously stored threshold 816a (FIG. 4) presently in use by the comparator detector 802 (FIG. 4) is likely to be incorrect as evidenced by a difference in switching rates of the comparator detector output signal 806a (FIG. 4) and the precision rotation detector output signal 810a (FIG. 4).

In another embodiment, the memory/threshold controller 920 can cause the storage only when the precision rotation detector output signal 903 has changed state by a predetermined number of times after the magnetic field sensor 400 of FIG. 4 has powered on. It will be understood that, these embodiments also allow the precision rotation detector 810 of FIG. 8 to achieve a stable positive peak signal 810b and a stable negative peak signal 810c.

Some types of precision rotation detectors are operable to detect peaks of the magnetic field signal, i.e., the magnetic field signal 414a of FIG. 4, and to provide a precision rotation detector output signal with state transitions that occur upon occurrences, or near to occurrences, of positive peaks or negative peaks of the magnetic field signal. (see, e.g., above-mentioned U.S. Pat. No. 7,199,579, issued Apr. 2, 2007) Therefore, the above-described embodiment for which storage occurs only when the precision rotation detector output signal 903 has changed state by a predetermined number of times can, in some embodiments, be equivalent to storage occurring only when a predetermined number of peaks have occurred in the magnetic field signal.

Storage operation of the memory/threshold controller 922 described by exemplary embodiments above can also have any combination of the above storage arrangements.

In some embodiments, whenever a storage is ongoing by the memory/threshold controller 920 the memory/threshold controller 920 can store a safety word into the safety word storage area 914.

The threshold module 900 can also optionally include a diagnostic module 924, which can be coupled to receive one or more of the stored measured threshold value 910a or the measured threshold value 906a. The diagnostic module 924 can be configured to generate a pass fail signal or value 924a. The pass fail value 924a can be indicative of the stored measured threshold value 910a and the measured threshold value 906a differing by more than a predetermined amount, which may occur, for example, when the magnetic field sensor 400 of FIG. 4 is powered down for a period of time and then re-powered.

As described above, it should be appreciated that, at a first power up of the magnetic field sensor 400 of FIG. 4, the control signal 920c can be used to direct the initial threshold value 916a to be the comparator threshold value 918a for some short time after the magnetic field sensor 400 is first powered up. Thereafter, the magnetic field sensor 400 can use either the stored measured threshold 910a, the measured threshold 906a, or the backup measured threshold 912a as the comparator threshold 918a, depending upon a condition of the word stored in the safety memory area 914 as detected by the memory/threshold controller 920.

With the above-described arrangement, it will be appreciated that the measured threshold value 906a, and therefore, the stored measured threshold value 910a, the stored backup measured threshold value 912a, and the comparator threshold 918a have already been gain and/or offset temperature compensated by operation of the circuits described above in conjunction with FIG. 4. However, as described above, the values can still change as the air gap between the gear 450 and the magnetic field sensor 402 of FIG. 4 changes or is different in different installations.

In some embodiments, optionally, the threshold module 900 can include a scaling module 926 and/or an offset module 928. The scaling module 926 is configured to apply a predetermined scaling, and the offset module is configured to apply a predetermined offset to the comparator threshold 918a, providing an alternate comparator threshold 928a suitable for use by some embodiments of the comparator detector 802 of FIG. 8. Of course the applied scaling can be one and the applied offset can be zero.

Furthermore, for embodiments described above in conjunction with FIG. 4, which do not have temperature compensation (no gain temperature compensation, and/or no offset temperature compensation, or neither) still the initial threshold value 916a, the measured threshold value 906a, the stored measured threshold value 910a, or the stored backup measured threshold value 912a can be selected for use as the comparator threshold value 918a, essentially with no alteration of the values, or with minimal alteration of the values before they are used by the comparator detector 802 of FIG. 8. The minimal alteration can include, for example, the above-described predetermined scaling and/or the predetermined offset to provide the alternate comparator threshold 928a suitable for use by some embodiments of the comparator detector 802 of FIG. 8. Of course the applied scaling can be one and the applied offset can be zero.

Figure 10:
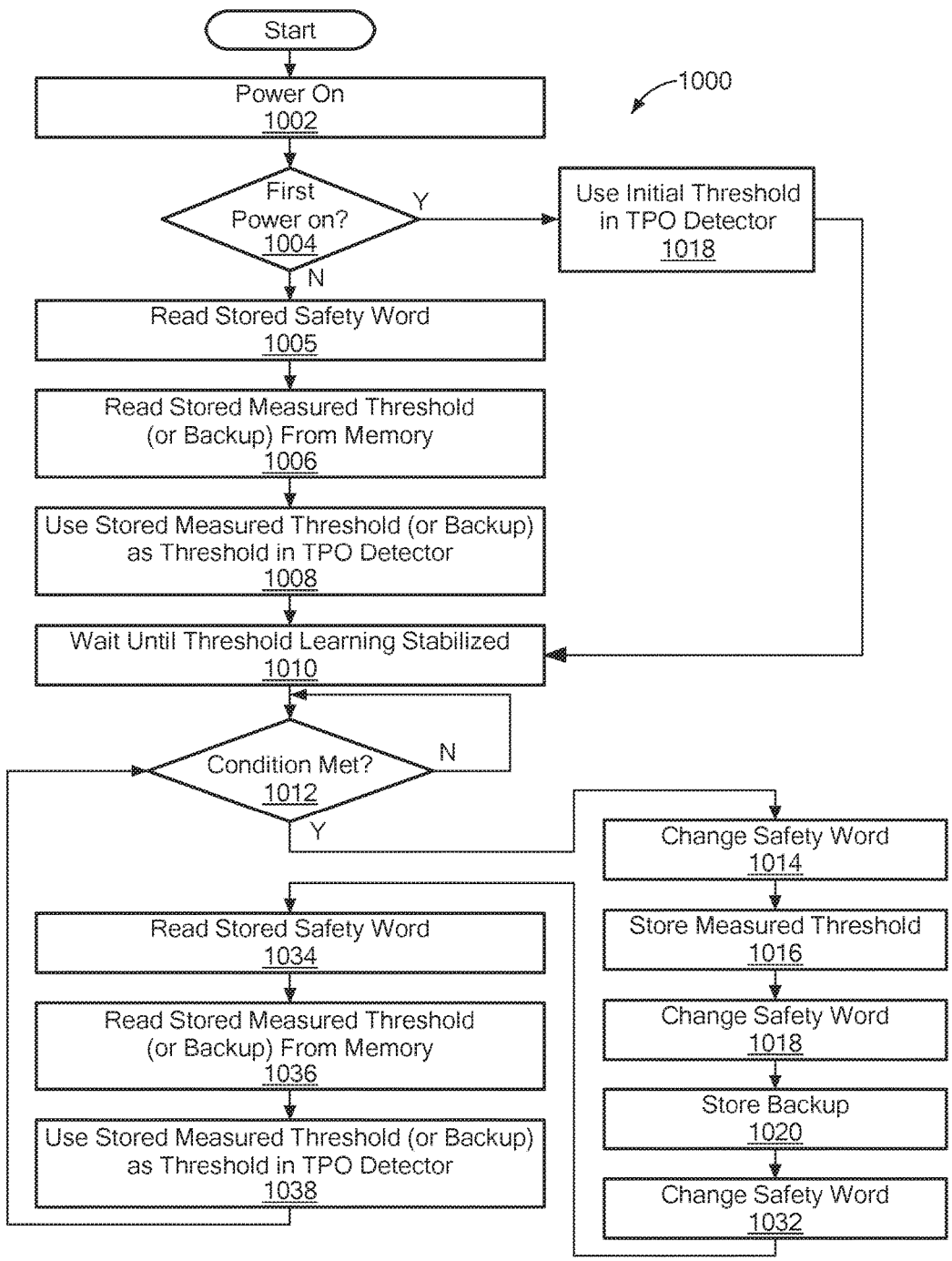
FIG. 10 is a flowchart showing an exemplary process for using a magnetic field sensor having the threshold module of FIG. 9.

Referring now to FIG. 10, a process 1000 can be used in conjunction with the threshold module 900 of FIG. 9. The process 1000 begins at block 1002, where the magnetic field sensor 400 of FIG. 4 is powered on. At block 1004, it is decided whether the power on of the magnetic field sensor 400 is a very first power on.

If the power on is not the very first power on, then at block 1005, the safety word (i.e., stored in the safety memory area 914 of FIG. 9) is read. From the above discussion, it will be apparent that the status of the safety word stored in safety storage area 914 is indicative of a proper or improper storage of the measured threshold value 906a in the stored threshold memory region 910, a proper or improper storage of the measured threshold value 906a in the backup stored threshold memory region 912, or all of the above.

At block 1006, depending upon the status of the safety word read at block 1005, the stored measured threshold value 910a (FIG. 9) or the stored backup measured threshold value 912a is read from the memory device 908 of FIG. 9.

At block 1008, the stored measured threshold value 910a, or the stored backup measured threshold value 912a, is used as the comparator threshold value 918a by the comparator detector 802 of FIG. 8.

At block 1010, if necessary, a wait time can be performed while the precision rotation detector 810 of FIG. 8 provides stable positive and negative peak values 810b, 810c (FIG. 8).

At block 1012, it is determined whether a predetermined condition is met. The predetermined conditions are described above in conjunction with FIG. 9. For example, one predetermined condition is that a predetermined number of transitions of the comparator detector output signal 902 of FIG. 9 has occurred. Other predetermined conditions are described above, and can be used in any combination.

If the condition or conditions have been met, then the process 1000 proceeds to a set of blocks 1014-1032, where the measure threshold value 906a of FIG. 9 is written into both the stored threshold memory region 910 and into the backup stored threshold region 912.

At block 1014, a value is written into the safety storage area 914 of FIG. 9 to indicate that storage is ongoing into the stored threshold memory region 910.

At block 1016, the measured threshold value 906a is written into the stored threshold memory region 910.

At block 1018, the word written into the safety word storage area 914 is changed to indicate that proper storage was made into the stored threshold memory region 910 and that storage into the backup stored threshold region 912 is ongoing.

At block 1020, the measured threshold value 906a is written into the backup stored threshold memory region 912.

At block 1032 the word stored in the safety memory region 914 is again changed to indicate that proper storage has occurred in both the stored threshold memory region 910 and in the backup stored threshold memory region 912.

At block 1034, the stored safety word in the safety memory region 914 is read, for example by the memory/threshold controller 920.

At block 1036, depending on the value of the safety word read at block 1034, either the stored measured threshold value 910a or the stored backup measured threshold value 912a is read from the memory device 908.

At block 1038, the stored measured threshold value 910a or the stored backup measured threshold value 912a read at block 1036 is used as the comparator threshold value 918a of FIG. 9, i.e., by the comparator detector 802 of FIG. 8. However, in some other embodiments, the comparator threshold value 918a of FIG. 9 (used at block 1038) can instead correspond to the measured threshold value 906a of FIG. 9 other than at times near to a power up (block 1002) of the magnetic field sensor 400 of FIG. 4, i.e., at times after the threshold learning of block 1010 has stabilized. For these embodiments, the reading of blocks 1034 and 1036 can be omitted.

At block 1012, if the predetermined condition is not met, then the process 1000 loops at block 1012 until such time that the predetermined condition is met.

At block 1004, if the power on is the very first power on then the process at block 1018 uses the initial threshold value stored in the initial threshold region 916 of FIG. 9 as the comparator threshold 918a of FIG. 9. Then the process jumps to block 1010.

It will be understood that a power down of the magnetic field sensor 400 of FIG. 4 that uses the process 1000 can occur at any time during the process 1000. Such power down will not be harmful. In particular, with the above arrangement that uses the safety word within blocks 1014-1032, at all times at least one of the stored measured threshold value 910a or the stored backup measured threshold value 912a will have been properly stored, and, by way of the safety word stored in the safety memory region 914, an acceptable one of the stored values can be used.

Figure 11:
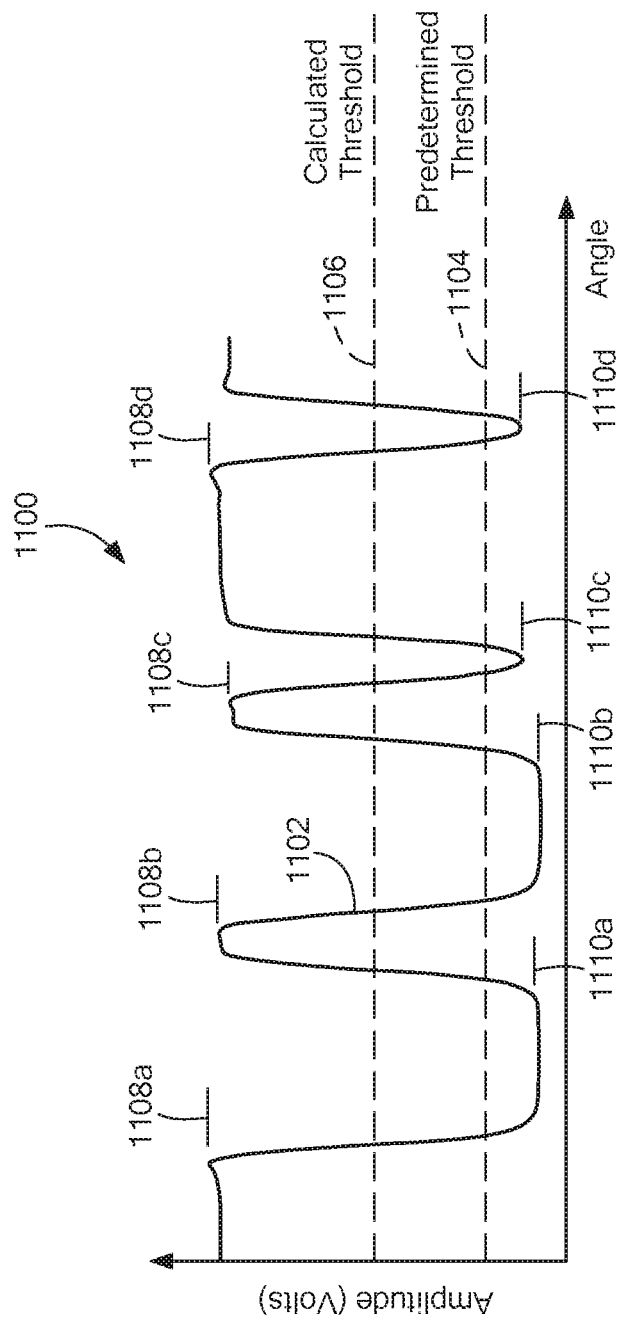
FIG. 11 is graph representing functions of the measured threshold module of FIG. 9.

Referring now to FIG. 11, a graph 1100 can be the same as or similar to the graph 50 of FIG. 2. Here, however, are shown positive peak values 1108a, 1108b, 1108c, 1108d of a signal 1102, and negative peak values 1110a, 1110b, 1110c, 1110d of the signal 1102. The positive peak values 1108a, 1108b, 1108c, 1108d are representative of values of the positive peak signal 904a of FIG. 9, and the negative peak values 1110a, 1110b, 1110c, 1110d are representative of values of the negative peak signal 904b of FIG. 9.

It will be understood that the signal 1102 is representative of one full rotation of the gear 450 of FIG. 4, therefore having four peaks and four valleys.

As described above in conjunction with FIG. 9, the measured threshold module 906 can combine the positive peak signal 904a and the negative peak signal 904b in a variety of ways. In one embodiment, the measured threshold module 906 can identify a smallest one of the positive peak values associated with one full rotation of the gear 450, e.g., 1108c, and a largest one of the negative peak values associated with the same full one rotation of the gear 450, e.g., 1110d. The measured threshold module 906 can use the two identified values and can set the measured threshold value 906a according to a predetermined percentage of a difference between the two values.

In another embodiment, the measured threshold module 906 of FIG. 9 can compute four different threshold values, a first threshold value according to a predetermined percentage of a difference between the positive peak value 1108a and the negative peak value 1110a, a second threshold value according to a predetermined percentage of a difference between the positive peak value 1108b and the negative peak value 1110b, a third threshold value according to a predetermined percentage of a difference between the positive peak value 1108c and the negative peak value 1110c, and a fourth threshold value according to a predetermined percentage of a difference between the positive peak value 1108d and the negative peak value 1110d. The measured threshold module 906 can average the four threshold values to generate the measured threshold value 906a. In another embodiment, the measured threshold module 906 can select a largest one of the four threshold values. In another embodiment, the measured threshold module 906 can select a smallest one of the four threshold values.

In another embodiments, the measured threshold module 906 of FIG. 9 can provide as the measured threshold value 906*a* (FIG. 9), a selected one of the positive peak values 1108*a*-1108*d*, a selected one of the negative peak values 1110*a*-1110*d*, an average of the positive peak values 1108*a*-1108*d*, an average of the negative peak values, a largest one of the positive peak values 1108*a*-1108*d*, a smallest one of the positive peak values 1108*a*-1108*d*, a largest one of the negative peak values 1110*a*-1110*d*, or a smallest one of the negative peak values 1110*a*-1110*d*.

Other combinations of the values 1108*a*-1108*d* of the positive peak signal and the values 1110*a*, 1110*d* of the negative peak signal can also be used. In still other arrangements, more positive peak values and/or more negative peak values, due, for example, to more gear teeth, or due to more revolutions of the gear 450 of FIG. 4, can be used in combined in ways similar to those ways described above.

In still other embodiments, an offset value can be added or subtracted to any one of the above-mentioned values to achieve the measured threshold value that is stored.

In general, the measured threshold module 906 of FIG. 9 can be configured to select at least one of a largest positive peak value from among the plurality of values of the positive peak signal (904*a*, FIG. 9), a smallest positive peak value from among the plurality of values of the positive peak signal 904*a*, a largest negative peak value from among the plurality of values of the negative peak signal (904*b*, FIG. 9)—or a smallest negative peak value from among the plurality of values of the negative peak signal 904*b*, and configured to generate the measured threshold value 906*a* in accordance with the at least one selected value.

Though the signal 1102 is shown to have positive peaks that are roughly the same and negative peaks that are roughly the same, for other gears, other than the gear 450 of FIG. 4, and, in particular, for gears that have very narrow teeth or very narrow valleys, positive peaks and/or negative peaks of the signal generated by rotation of the gear can have values that differ from other ones of the positive peaks and/or negative peaks. The above arrangements tend to provide an ultimate comparator threshold 1106 through which all the positive to negative and negative to positive transitions of the signal 1102 pass.

All references cited herein are hereby incorporated herein by reference in their entirety. Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
one or more magnetic field sensing elements configured to generate a magnetic field signal responsive to a magnetic field;
a detector circuit configured to receive the magnetic field signal and configured to identify a signal characteristic related to the magnetic field signal;
a threshold module coupled to the detector circuit to receive the identified signal characteristic and configured to generate one or more measured threshold values based upon the identified signal characteristic;
a nonvolatile memory device configured to store, at one or more storage times, the one or more measured threshold values in a primary storage region; and
a comparison circuit configured to receive, at one or more receipt times occurring after at least one of the one or more storage times, at least one of the stored one or more measured threshold values and the magnetic field signal, the comparison circuit configured to receive the at least one of the stored one or more measured threshold values without combining a temperature coefficient with the at least one of the stored one or more measured threshold values, wherein the comparison circuit is configured to compare the at least one of the stored one or more measured threshold values with the magnetic field signal to generate a comparison circuit output signal, wherein one of the one or more storage times occurs at a time proximate to a time of powering off the magnetic field sensor and one of the one or more receipt times occurs at a time proximate to a time of powering on the magnetic field sensor.

2. The magnetic field sensor of claim 1, further comprising:
a temperature compensating circuit configured to receive the magnetic field signal and configured to generate a temperature compensated signal having the signal characteristic comprising at least one of an amplitude or an offset.

3. The magnetic field sensor of claim 2, wherein the temperature compensating circuit comprises:
a gain adjustable circuit configured to receive a signal representative of the magnetic field signal, configured to receive a gain control signal, and configured to generate a gain adjusted signal having a gain responsive to the gain control signal;
a coefficient table memory configured to store a plurality of gain correction coefficients associated with respective boundaries of a plurality of temperature segments, each temperature segment bounded by a pair of temperatures;
a temperature sensor configured to generate a temperature signal representative of a temperature of the magnetic field sensor; and
a segment processor configured to receive the temperature signal, configured to identify a temperature segment in which the temperature of the magnetic field sensor lies, configured to receive selected ones of the stored plurality of gain correction coefficients associated with the identified temperature segment, and configured to interpolate using the selected ones of the stored plurality of gain correction coefficients in accordance with the temperature signal to generate the gain control signal in accordance with an interpolated gain correction value.

4. The magnetic field sensor of claim 1, wherein another one of the one or more storage times occurs at a time corresponding to a predetermined time after the magnetic field sensor is powered on.

5. The magnetic field sensor of claim 1, another one of the one or more storage times occurs at a time corresponding to a predetermined number of edges of the comparison circuit output signal.

6. The magnetic field sensor of claim 1, wherein another one of the one or more storage times occurs at a time when one of the one or more measured threshold values changes by an amount greater than a predetermined amount.

7. The magnetic field sensor of claim 1, wherein another one of the one or more storage times occurs at a time when one of the one or more measured threshold values differs from one of the stored one or more measured threshold values by a predetermined amount.

8. The magnetic field sensor of claim 1, wherein another one of the one or more storage times occurs at a time when a rate of state change of the comparison circuit output signal differs from a rate of state change of another signal generated in the magnetic field sensor.

9. The magnetic field sensor of claim 1, further comprising:
a diagnostic module configured to compare one of the one or more measured threshold values and one of the stored one or more measured threshold values, and configured to generate a fail value if the one of the measured one or more threshold values and the one of the stored one or more measured threshold values differ by more than a predetermined amount.

10. The magnetic field sensor of claim 1, wherein the nonvolatile memory device is further configured to also store the one or more measured threshold values in a backup memory region at a different time than the one or more storage times.

11. The magnetic field sensor of claim 1, wherein the magnetic field signal comprises an analog magnetic field signal.

12. A method of sensing a magnetic field with a magnetic field sensor, comprising:
generating a magnetic field signal responsive to the magnetic field;
identifying a signal characteristic related to the magnetic field signal;
generating one or more measured threshold values based upon the identified signal characteristic;
storing, in a nonvolatile memory device, at one or more storage times, the one or more measured threshold values in a primary storage region;
receiving, at one or more receipt times occurring after at least one of the one or more storage times, with a comparison circuit, one of the stored one or more measured threshold values and the magnetic field signal without combining a temperature coefficient with the one of the stored one or more measured threshold values; and
comparing, with the comparison circuit, the one of the stored one or more measured threshold values with the magnetic field signal to generate a comparison circuit output signal, wherein one of the one or more storage times occurs at a time proximate to a time of powering off the magnetic field sensor and one of the one or more receipt times occurs at a time proximate to a time of powering on the magnetic field sensor.

13. The method of claim 12, further comprising:
generating a temperature compensated signal related to the magnetic field signal, wherein the temperature compensated signal comprises the signal characteristic comprising at least one of the amplitude or the offset.

14. The method of claim 13, wherein the generating the temperature compensated signal comprises:
generating a gain adjusted signal having a gain responsive to a gain control signal;
providing a coefficient table memory configured to store a plurality of gain correction coefficients associated with respective boundaries of a plurality of temperature segments, each temperature segment bounded by a pair of temperatures;
generating a temperature signal representative of a temperature of the magnetic field sensor;
identifying a temperature segment in which the temperature of the magnetic field sensor lies;
receiving selected ones of the stored plurality of gain correction coefficients associated with the identified temperature segment; and
interpolating using the selected ones of the stored plurality of gain correction coefficients in accordance with the temperature signal to generate the gain control signal in accordance with an interpolated gain correction value.

15. The method of claim 12, wherein another one of the one or more storage times occurs at a time corresponding to a predetermined time after the magnetic field sensor is powered on.

16. The method of claim 12, wherein another one of the one or more storage times occurs at a time corresponding to a predetermined number of edges of the comparison circuit output signal.

17. The method of claim 12, wherein another one of the one or more storage times occurs at a time when one of the one or more measured threshold values changes by an amount greater than a predetermined amount.

18. The method of claim 12, wherein another one of the one or more storage times occurs at a time when one of the one or more measured threshold values differs from the one of the stored one or more measured threshold values by a predetermined amount.

19. The method of claim 12, wherein another one of the one or more storage times occurs at a time when a rate of state change of the comparison circuit output signal differs from a rate of state change of another signal generated in the magnetic field sensor.

20. The method of claim 12, further comprising:
comparing one of the measured one or more threshold values and one of the stored one or more measured threshold values; and
generating a fail value if the one of the measured one or more threshold values and the one of the stored one or more measured threshold values differ by more than a predetermined amount.

21. The method of claim 12, further comprising also storing, in the nonvolatile memory device, the one or more measured threshold values in a backup memory region at a different time than the one or more storage times.

22. The method of claim 12, wherein the magnetic field signal comprises an analog magnetic field signal.

23. A magnetic field sensor, comprising:
one or more magnetic field sensing elements configured to generate a magnetic field signal responsive to a magnetic field;
a circuit configured to receive the magnetic field signal and configured to identify a signal characteristic related to the magnetic field signal, the signal characteristic comprising at least one of an amplitude or an offset;
a nonvolatile memory device configured to store, at a storage time, a measured threshold value related to the signal characteristic;
a comparison circuit configured to receive, at a receipt time after the storage time, a comparison circuit threshold value corresponding to the stored measured threshold value, and also configured to receive a signal representative of the magnetic field signal, the comparison circuit configured to receive the stored measured threshold value without combining a temperature coefficient with the stored measured threshold value, wherein the comparison circuit is configured to compare the comparison circuit threshold value with the signal representative of the magnetic field signal to generate a comparison circuit output signal; and a temperature compensating circuit configured to receive the magnetic field signal and configured to generate a temperature compensated signal having the signal characteristic comprising at least one of the amplitude or the offset, wherein the temperature compensating circuit comprises:

a gain adjustable circuit configured to receive a signal representative of the magnetic field signal, configured to receive a gain control signal, and configured to generate a gain adjusted signal having a gain responsive to the gain control signal;

a coefficient table memory configured to store a plurality of gain correction coefficients associated with respective boundaries of a plurality of temperature segments, each temperature segment bounded by a pair of temperatures;

a temperature sensor configured to generate a temperature signal representative of a temperature of the magnetic field sensor; and a segment processor configured to receive the signal representative of the temperature of the magnetic field sensor, configured to identify a temperature segment in which the temperature of the magnetic field sensor lies, configured to receive selected ones of the stored plurality of gain correction coefficients associated with the identified temperature segment, and configured to interpolate using the selected ones of the stored plurality of gain correction coefficients in accordance with the temperature signal to generate the gain control signal in accordance with an interpolated gain correction value.

24. The magnetic field sensor of claim 23, wherein the nonvolatile memory device is further configured to also store the measured threshold value in a backup memory region at a different time than the storage time.

25. The magnetic field sensor of claim 23, wherein the magnetic field signal comprises an analog magnetic field signal.

26. A method of sensing a magnetic field with a magnetic field sensor, comprising:

generating a magnetic field signal responsive to the magnetic field;

identifying a signal characteristic related to the magnetic field signal, the signal characteristic comprising at least one of an amplitude or an offset;

storing, in a nonvolatile memory device, at a storage time, a measured threshold value related to the signal characteristic;

receiving, at a receipt time after the storage time, with a comparison circuit, a comparison circuit threshold value corresponding to the stored measured threshold value and a signal representative of the magnetic field signal, the receiving the stored measured threshold value without combining a temperature coefficient with the stored measured threshold value;

comparing, with the comparison circuit, the comparison circuit threshold value with the signal representative of the magnetic field signal to generate a comparison circuit output signal; and generating a temperature compensated signal related to the magnetic field signal, wherein the temperature compensated signal comprises the signal characteristic comprising at least one of the amplitude or the offset; wherein the generating the temperature compensated signal comprises:

generating a gain adjusted signal having a gain responsive to a gain control signal;

providing a coefficient table memory configured to store a plurality of gain correction coefficients associated with respective boundaries of a plurality of temperature segments, each temperature segment bounded by a pair of temperatures;

generating a temperature signal representative of a temperature of the magnetic field sensor;

identifying a temperature segment in which the temperature of the magnetic field sensor lies;

receiving selected ones of the stored plurality of gain correction coefficients associated with the identified temperature segment; and interpolating using the selected ones of the stored plurality of gain correction coefficients in accordance with the temperature signal to generate the gain control signal in accordance with an interpolated gain correction value.

27. The method of claim 26, further comprising also storing, in the nonvolatile memory device, the measured threshold value in a backup memory region at a different time than the storage time.

28. The method of claim 26, wherein the magnetic field signal comprises an analog magnetic field signal.

29. A magnetic field sensor, comprising:

one or more magnetic field sensing elements configured to generate a magnetic field signal responsive to a magnetic field;

a detector circuit configured to receive the magnetic field signal and configured to identify a signal characteristic related to the magnetic field signal;

a threshold module coupled to the detector circuit to receive the identified signal characteristic and configured to generate a measured threshold value based upon the identified signal characteristic;

a nonvolatile memory device configured to store, at a storage time, the measured threshold value;

a comparison circuit configured to receive, at a receipt time after the storage time, the stored measured threshold value and the magnetic field signal, the comparison circuit configured to receive the stored measured threshold value without combining a temperature coefficient with the stored measured threshold value, wherein the comparison circuit is configured to compare the stored measured threshold value with the magnetic field signal to generate a comparison circuit output signal;

a temperature compensating circuit configured to receive the magnetic field signal and configured to generate a temperature compensated signal having the signal characteristic comprising least one of an amplitude or an offset, wherein the temperature compensating circuit comprises:

a gain adjustable circuit configured to receive a signal representative of the magnetic field signal, configured to receive a gain control signal, and configured to generate a gain adjusted signal having a gain responsive to the gain control signal;

a coefficient table memory configured to store a plurality of gain correction coefficients associated with respective boundaries of a plurality of temperature segments, each temperature segment bounded by a pair of temperatures;

a temperature sensor configured to generate a temperature signal representative of a temperature of the magnetic field sensor; and a segment processor configured to receive a signal representative of the temperature, configured to identify a temperature segment in which the temperature of the magnetic field sensor lies, configured to receive selected ones of the stored plurality of gain correction coefficients associated with the identified temperature segment, and configured to interpolate using the selected ones of the stored plurality of gain correction coefficients in accordance with the temperature signal to generate the gain control signal in accordance with an interpolated gain correction value.

30. The magnetic field sensor of claim 29, wherein the nonvolatile memory device is further configured to also store the measured threshold value in a backup memory region at a different time than the storage time.

31. The magnetic field sensor of claim 29, wherein the magnetic field signal comprises an analog magnetic field signal.

32. A method of sensing a magnetic field with a magnetic field sensor, comprising:
   generating a magnetic field signal responsive to the magnetic field;
   identifying a signal characteristic related to the magnetic field signal, the signal characteristic comprising at least one of an amplitude or an offset;
   generating a measured threshold value based upon the identified signal characteristic;
   storing, in a nonvolatile memory device, at a storage time, the measured threshold value;
   receiving, at a receipt time occurring after the storage time, with a comparison circuit, the stored measured threshold value and the magnetic field signal without combining a temperature coefficient with the stored measured threshold value; and
   comparing, with the comparison circuit, the stored measured threshold value with the magnetic field signal to generate a comparison circuit output signal;
   generating a temperature compensated signal related to the magnetic field signal, wherein the temperature compensated signal comprises the signal characteristic comprising at least one of the amplitude or the offset, wherein the generating the temperature compensated signal comprises:
     generating a gain adjusted signal having a gain responsive to a gain control signal;
     providing a coefficient table memory configured to store a plurality of gain correction coefficients associated with respective boundaries of a plurality of temperature segments, each temperature segment bounded by a pair of temperatures;
     generating a temperature signal representative of a temperature of the magnetic field sensor;
     identifying a temperature segment in which the temperature of the magnetic field sensor lies;
     receiving selected ones of the stored plurality of gain correction coefficients associated with the identified temperature segment; and
     interpolating using the selected ones of the stored plurality of gain correction coefficients in accordance with the temperature signal to generate the gain control signal in accordance with an interpolated gain correction value.

33. The method of claim 32, further comprising also storing, in the nonvolatile memory device, the measured threshold value in a backup memory region at a different time than the storage time.

34. The method of claim 32, wherein the magnetic field signal comprises an analog magnetic field signal.

* * * * *

UNITED STATES PATENT AND TRADEMARK OFFICE
CERTIFICATE OF CORRECTION

PATENT NO. : 11,009,565 B2  
APPLICATION NO. : 15/132642  
DATED : May 18, 2021  
INVENTOR(S) : Devon Fernandez et al.

Page 1 of 1

It is certified that error appears in the above-identified patent and that said Letters Patent is hereby corrected as shown below:

In the Specification

Column 3, Line 49-50, delete "comprising least" and replace with --comprising of at least--.
Column 4, Line 48, delete "comprising least" and replace with --comprising of at least--.
Column 4-5, Line 67-1, delete "comprising least" and replace with --comprising of at least--.
Column 12, Line 19, delete "KIEV" and replace with --$K_{DEV}$--.
Column 12, Equation 3, delete "CoeFFA" and replace with --CoeffA--.
Column 12, Equation 4, delete "CoeFFA" and replace with --CoeffA--.
Column 12, Equation 7, delete "CoeFFA" and replace with --CoeffA--.
Column 15, Line 38, delete ", 62,5 to 113.75," and replace with --, 62.5 to 113.75,--.
Column 23, Line 44, delete "(FIG. 4)" and replace with --(FIG. 8)--.
Column 23, Line 45, delete "(FIG. 4)" and replace with --(FIG. 8)--.
Column 23, Line 47, delete "(FIG. 4)" and replace with --(FIG. 8)--.
Column 23, Line 48, delete "(FIG. 4)" and replace with --(FIG. 8)--.

In the Claims

Column 28, Line 57, delete "claim 1, another" and replace with --claim 1, wherein another--.
Column 32, Line 52, delete "comprising least" and replace with --comprising at least--.

Signed and Sealed this  
Fourth Day of March, 2025

Coke Morgan Stewart  
*Acting Director of the United States Patent and Trademark Office*